(12) United States Patent
Hidaka et al.

(10) Patent No.: US 7,248,020 B2
(45) Date of Patent: Jul. 24, 2007

(54) BATTERY-VOLTAGE MONITORING INTEGRATED-CIRCUIT AND BATTERY-VOLTAGE MONITORING SYSTEM

(75) Inventors: Takao Hidaka, Tokyo (JP); Yoshiyuki Nakagomi, Kokubunji (JP)

(73) Assignees: Renesas Technology Corp., Tokyo (JP); Yashima Denki Co., Ltd., Tokyo (JP)

( * ) Notice: Subject to any disclaimer, the term of this patent is extended or adjusted under 35 U.S.C. 154(b) by 0 days.

(21) Appl. No.: 11/178,395

(22) Filed: Jul. 12, 2005

(65) Prior Publication Data

US 2006/0012337 A1   Jan. 19, 2006

(30) Foreign Application Priority Data

Jul. 14, 2004   (JP)   ............................. 2004-206944

(51) Int. Cl.
*H02J 7/00* (2006.01)

(52) U.S. Cl. ...................... 320/134; 320/136; 320/118; 320/116

(58) Field of Classification Search ................ 320/134, 320/136, 118, 116
See application file for complete search history.

(56) References Cited

U.S. PATENT DOCUMENTS

| 6,020,717 A * | 2/2000 | Kadouchi et al. ........... 320/116 |
| 6,172,485 B1 * | 1/2001 | Fujita et al. ................. 320/136 |
| 6,396,246 B2 * | 5/2002 | Haraguchi et al. .......... 320/134 |
| 6,492,791 B1 * | 12/2002 | Saeki et al. .................. 320/135 |
| 2003/0044689 A1 * | 3/2003 | Miyazaki et al. ........... 429/320 |

FOREIGN PATENT DOCUMENTS

| JP | 2001-085067 | 3/2001 |
| JP | 2001-224138 | 8/2001 |

* cited by examiner

*Primary Examiner*—Karl Easthom
*Assistant Examiner*—Alexis Boateng
(74) *Attorney, Agent, or Firm*—McDermott Will & Emery LLP

(57) ABSTRACT

A first voltage source terminal, to which a first voltage is input, is connected to a maximum voltage terminal of serially-connected secondary batteries to be monitored. A second voltage source terminal, to which a second voltage is input, is connected to a minimum voltage terminal of the secondary batteries. A battery-voltage detecting unit outputs a detection signal based on a result of a voltage monitoring. A first reference-voltage generating unit receives the first and the second voltages as operating voltages, and generates a first reference voltage. A voltage converting unit receives the detection signal, and converts the detection signal received into either the first reference voltage or the second voltage. An output terminal outputs the detection signal converted, as an output detection signal.

13 Claims, 9 Drawing Sheets

LEVEL SHIFTING CIRCUIT

BATTERY-VOLTAGE MONITORING INTEGRATED-CIRCUIT AND BATTERY-VOLTAGE MONITORING SYSTEM

BACKGROUND OF THE INVENTION

1) Field of the Invention

The present invention relates to a battery-voltage monitoring integrated-circuit and a battery-voltage monitoring system for monitoring a voltage of a secondary (rechargeable) battery, such as a lithium-ion rechargeable battery.

2) Description of the Related Art

Compared to other rechargeable batteries, a lithium-ion battery has the following advantages, namely, it produces high-energy density (high output density), gives a high battery voltage (4.2 V) per battery cell, has a high charging-discharging energy efficiency, has no memory effect, etc. Consequently, lithium-ion batteries are being widely used in compact gadgets such as, mobile phones, video cameras, notebook computers, etc.

Because of these advantages, lithium-ion batteries are expected to replace the conventionally used nickel-metal-hydride batteries employed in hybrid vehicles, motor driving devices, etc.

However, the property of high-energy density of a lithium-ion battery can make it potentially dangerous should a short-circuit occur within it due to any reason, since the energy is released all at once. Therefore, to avoid any mishap, it is usual practice to take precautionary measures such as using a heat-stable material, avoiding over-charging or over-discharging the battery, or even if the battery is over-charged or over-discharged, taking care not to allow the temperature of the battery to rise and causing it to ignite.

As a measure against over-charging or over-discharging, a method for monitoring the voltage of the lithium-ion battery is employed. In other words, the lithium-ion battery, which usually consists of a plurality of serially-connected battery cells that output the voltage required for the gadget in which the battery is used, is monitored, and when any of the battery cells is over-discharged or over-charged, an error signal is output, causing a forced stopping of charging or discharging (see, for example, Japanese Patent Laid-Open Publication No. 2001-224138 and Japanese Patent Laid-Open Publication No. 2001-85067).

An integrated-circuit for battery voltage monitoring may be used for monitoring the battery cells of the lithium-ion battery and outputting a detection signal when any battery cell shows signs of over-charging or over-discharging, thus providing a system for monitoring battery voltage that performs efficient voltage monitoring.

However, hybrid vehicles and motor driving device require high voltage, necessitating serially connecting an appropriate number of the lithium-ion batteries to obtain the required voltage. If a single battery-voltage monitoring integrated-circuit is to be used in such a setup, the integrated-circuit needs to be constructed from an element that can withstand high voltage, since it has to withstand the voltage from all the battery cells, and the surface area of the chip has to be considerably large, pushing up the cost.

Further, since the voltage required by different gadgets are different, the battery-voltage monitoring integrated-circuit, built for gadgets that require high voltage levels, will prove to be an overkill for the gadgets that need less voltage, again pushing up the cost.

To overcome this drawback, the battery-voltage monitoring integrated-circuit is built for handling a specific number of lithium-ion batteries. If the number of cells in the serially-connected battery cell group being monitored exceeds the range, as many battery-voltage monitoring integrated-circuits as are required may be connected serially, stacking them one on top of another. This method makes the battery-voltage monitoring integrated-circuit cost-effective.

However, even in the method using stacked battery voltage monitoring circuits, since only a single control circuit controls charging and discharging based on the detection result, how the detection result of each of the battery-voltage monitoring integrated-circuits is to be transmitted to the single control circuit poses a problem.

A method of insulating the detection result from each of the battery-voltage monitoring integrated-circuit by a photo coupler, etc. and transmitting to the control circuit by changing the voltage to the ground voltage may be adopted. However, this method will again push up the cost since a photo coupler needs to be provided for each battery-voltage monitoring integrated-circuit.

Other methods like providing a circuit that integrates the detection results from all the stacked battery-voltage monitoring integrated-circuits, or providing a control circuit having as many number of input terminals as there are battery-voltage monitoring integrated-circuits, etc. will not only make the circuitry complicated, but will also push up the cost.

SUMMARY OF THE INVENTION

It is an object of the present invention to solve at least the above problems in the conventional technology.

A battery-voltage monitoring integrated-circuit according to one aspect of the present invention, which monitors a voltage of each of a specified-number of serially-connected secondary batteries, includes a first voltage source terminal that is connected to a maximum voltage terminal of the secondary batteries to be monitored, a first voltage being input to the first voltage source terminal; a second voltage source terminal that is connected to a minimum voltage terminal of the secondary batteries to be monitored, a second voltage being input to the second voltage source terminal; a battery-voltage detecting unit that outputs a detection signal based on a result of a voltage monitoring of each of the secondary batteries; a first reference-voltage generating unit that receives the first voltage and the second voltage as operating voltages, and generates a first reference voltage; a first voltage converting unit that receives the detection signal, and converts the detection signal received into either the first reference voltage or the second voltage; and an output terminal that outputs the detection signal converted by the first voltage converting unit as an output detection signal.

A battery-voltage monitoring integrated-circuit according to another aspect of the present invention, which monitors a voltage of each of a specified-number of serially-connected secondary batteries, includes a first voltage source terminal that is connected to a maximum voltage terminal of the secondary batteries to be monitored, a first voltage being input to the first voltage source terminal; a second voltage source terminal that is connected to a minimum voltage terminal of the secondary batteries to be monitored, a second voltage being input to the second voltage source terminal; a first input terminal to which an output detection signal is input; a first reference-voltage generating unit that receives the first voltage and the second voltage as operating voltages, and generates a first reference voltage; a second reference-voltage generating unit that receives the first voltage and the second voltage as operating voltages, and generates a second reference voltage; a first voltage converting unit that receives the output detection signal, and converts the output detection signal received into either the first reference voltage or the second voltage; a second reference-voltage output terminal that outputs the second reference voltage; and a first output terminal that outputs the output detection signal converted by the first voltage converting unit as an output detection signal.

A battery-voltage monitoring integrated-circuit according to still another aspect of the present invention, which monitors a voltage of each of a specified-number of serially-connected secondary batteries, includes a first voltage source terminal that is connected to a maximum voltage terminal of the secondary batteries to be monitored, a first voltage being input to the first voltage source terminal; a second voltage source terminal that is connected to a minimum voltage terminal of the secondary batteries to be monitored, a second voltage being input to the second voltage source terminal; an input terminal to which a control signal is input; a reference-voltage generating unit that receives the first voltage and the second voltage as operating voltages, and generates a reference voltage; a voltage converting unit that receives the control signal, and converts the control signal received into either the reference voltage or the second voltage; and a reference-voltage output terminal that outputs the reference voltage.

A battery-voltage monitoring integrated-circuit according to still another aspect of the present invention, which monitors a voltage of each of a specified-number of serially-connected secondary batteries, includes a first voltage source terminal that is connected to a maximum voltage terminal of the secondary batteries to be monitored, a first voltage being input to the first voltage source terminal; a second voltage source terminal that is connected to a minimum voltage terminal of the secondary batteries to be monitored, a second voltage being input to the second voltage source terminal; an input terminal to which a control signal is input; a reference-voltage generating unit that receives the first voltage and the second voltage as operating voltages, and generates a reference voltage; a voltage converting unit that receives the control signal, and converts the control signal received into either the reference voltage or the second voltage; a control unit that controls a supply of the control signal converted by the voltage converting unit to an output terminal with the reference voltage; and a reference-voltage output terminal that outputs the reference voltage.

A battery-voltage monitoring integrated-circuit according to still another aspect of the present invention, which monitors a voltage of each of a specified-number of serially-connected secondary batteries, includes a first voltage source terminal that is connected to a maximum voltage terminal of the secondary batteries to be monitored, a first voltage being input to the first voltage source terminal; a second voltage source terminal that is connected to a minimum voltage terminal of the secondary batteries to be monitored, a second voltage being input to the second voltage source terminal; a clock input terminal to which a clock signal is input; a data input terminal to which a data signal is input; a first reference-voltage generating unit that receives the first voltage and the second voltage as operating voltages, and generates a first reference voltage; a second reference-voltage generating unit that receives the first voltage and the second voltage as operating voltages, and generates a second reference voltage; a first voltage converting unit that receives the clock signal, and converts the clock signal received into either the first voltage or the second voltage; a second voltage converting unit that receives the data signal, and converts the data signal received into either the first voltage or the second voltage; a flip-flop that accepts the data signal converted by the second voltage converting unit according to the clock signal converted by the first voltage converting unit; a third voltage converting unit that the clock signal converted by the first voltage converting unit, and converts the clock signal converted by the first voltage converting unit received into either the first voltage or the second voltage; a fourth voltage converting unit that receives the data signal converted by the second voltage converting unit, and converts the data signal converted by the second voltage converting unit received into either the first voltage or the second voltage; a first control unit that controls a supply of the clock signal converted by the third voltage converting unit to a clock output terminal with the second reference voltage; a second control unit that controls a supply of the data signal converted by the fourth voltage converting unit to a data output terminal with the second reference voltage; and a reference-voltage output terminal that outputs the first reference voltage.

A battery-voltage monitoring system according to still another aspect of the present invention includes a first battery-voltage monitoring integrated-circuit including a first voltage source terminal that is connected to a maximum voltage terminal of a specified-number of serially-connected secondary batteries to be monitored, a first voltage being input to the first voltage source terminal, a second voltage source terminal that is connected to a minimum voltage terminal of the secondary batteries to be monitored, a second voltage being input to the second voltage source terminal, a battery-voltage detecting unit that outputs a detection signal based on a result of a voltage monitoring of each of the secondary batteries, a first reference-voltage generating unit that receives the first voltage and the second voltage as operating voltages, and generates a first reference voltage, a first voltage converting unit that receives the detection signal, and converts the detection signal received into either the first reference voltage or the second voltage, and a first output terminal that outputs the detection signal converted by the first voltage converting unit as an output detection signal; at least one battery-voltage monitoring integrated-circuit including a third voltage source terminal that is connected to a maximum voltage terminal of the secondary batteries to be monitored, a third voltage being input to the third voltage source terminal, a fourth voltage source terminal that is connected to a minimum voltage terminal of the secondary batteries to be monitored, a fourth voltage being input to the fourth voltage source terminal, a first input terminal to which an output detection signal is input, a second reference-voltage generating unit that receives the third voltage and the fourth voltage as operating voltages, and generates a second reference voltage, a third reference-voltage generating unit that receives the third voltage and the fourth voltage as operating voltages, and generates a third reference voltage, a second voltage converting unit that receives the output detection signal, and converts the output detection signal received into either the second reference voltage or the fourth voltage, a reference-voltage output terminal that outputs the third reference voltage, and a second output terminal that outputs the output detection signal converted by the second voltage converting unit as an output detection signal; and a control circuit including a second input terminal, one voltage source terminal, and other voltage source terminal. The second integrated-circuit is serially connected to a lower stage of the first integrated-circuit. The second voltage source terminal is connected to the third voltage source terminal. The first output terminal is connected to the reference-voltage output terminal via a resistive potential-dividing circuit. A divided-voltage output terminal of the resistive potential-dividing circuit is connected to the second input terminal. The second output terminal of a lowest-stage second integrated-circuit is connected to the second input terminal. The fourth voltage source terminal of the lowest-stage second integrated-circuit is connected to the one voltage source terminal.

A battery-voltage monitoring system according to still another aspect of the present invention includes a first battery-voltage monitoring integrated-circuit including a first voltage source terminal that is connected to a maximum voltage terminal of a specified-number of serially-connected secondary batteries to be monitored, a first voltage being input to the first voltage source terminal, a second voltage source terminal that is connected to a minimum voltage terminal of the secondary batteries to be monitored, a second voltage being input to the second voltage source terminal, a battery-voltage detecting unit that outputs a detection signal based on a result of a voltage monitoring of each of the secondary batteries, a first reference-voltage generating unit that receives the first voltage and the second voltage as operating voltages, and generates a first reference voltage, a first voltage converting unit that receives the detection signal, and converts the detection signal received into either the first reference voltage or the second voltage, and a first output terminal that outputs the detection signal converted by the first voltage converting unit as an output detection signal; at least one battery-voltage monitoring integrated-circuit including a third voltage source terminal that is connected to a maximum voltage terminal of the secondary batteries to be monitored, a third voltage being input to the third voltage source terminal, a fourth voltage source terminal that is connected to a minimum voltage terminal of the secondary batteries to be monitored, a fourth voltage being input to the fourth voltage source terminal, a first input terminal to which an output detection signal is input, a second reference-voltage generating unit that receives the third voltage and the fourth voltage as operating voltages, and generates a second reference voltage, a third reference-voltage generating unit that receives the third voltage and the fourth voltage as operating voltages, and generates a third reference voltage, a second voltage converting unit that receives the output detection signal, and converts the output detection signal received into either the second reference voltage or the fourth voltage, a reference-voltage output terminal that outputs the third reference voltage, a second output terminal that outputs the output detection signal converted by the second voltage converting unit as an output detection signal, and a logical circuit that performs a logical operation on the output detection signal converted by the second voltage converting unit and the detection signal, and outputs a voltage corresponding to either the second reference voltage or the fourth voltage; and a control circuit including a second input terminal, one voltage source terminal, and other voltage source terminal. The second integrated-circuit is serially connected to a lower stage of the first integrated-circuit. The second voltage source terminal is connected to the third voltage source terminal. The first output terminal is connected to the reference-voltage output terminal via a resistive potential-dividing circuit. T divided-voltage output terminal of the resistive potential-dividing circuit is connected to the second input terminal. The second output terminal of a lowest-stage second integrated-circuit is connected to the second input terminal. The fourth voltage source terminal of the lowest-stage second integrated-circuit is connected to the one voltage source terminal.

A battery-voltage monitoring system according to still another aspect of the present invention includes at least two battery-voltage monitoring integrated-circuits serially-connected from an upper stage to a lower stage, including a first voltage source terminal that is connected to a maximum voltage terminal of a specified-number of serially-connected secondary batteries to be monitored, a first voltage being input to the first voltage source terminal, a second voltage source terminal that is connected to a minimum voltage terminal of the secondary batteries to be monitored, a second voltage being input to the second voltage source terminal, a first input terminal to which an output detection signal is input, a first reference-voltage generating unit that receives the first voltage and the second voltage as operating voltages, and generates a first reference voltage, a second reference-voltage generating unit that receives the first voltage and the second voltage as operating voltages, and generates a second reference voltage, a voltage converting unit that receives the output detection signal, and converts the output detection signal received into either the first reference voltage or the second voltage, a reference-voltage output terminal that outputs the second reference voltage, an output terminal that outputs the output detection signal converted by the first voltage converting unit as an output detection signal, a battery-voltage detecting unit that outputs a detection signal based on a result of a voltage monitoring of each of the secondary batteries, and a logical circuit that performs a logical operation on the output detection signal converted by the voltage converting unit and the detection signal, and outputs a voltage corresponding to either the first reference voltage or the second voltage; and a control circuit including a second input terminal, one voltage source terminal, and other voltage source terminal. The second voltage source terminal of an upper-stage battery-voltage monitoring integrated-circuit is connected to the first voltage source terminal of a lower-stage battery-voltage monitoring integrated-circuit. The output terminal of the upper-stage battery-voltage monitoring integrated-circuit is connected to the second reference-voltage output terminal of the lower-stage battery-voltage monitoring integrated-circuit via a resistive potential-dividing circuit. A divided-voltage output terminal of the resistive potential-dividing circuit is connected to the first input terminal of the lower-stage battery-voltage monitoring integrated-circuit. The output terminal of a lowest-stage battery-voltage monitoring integrated-circuit is connected to the second input terminal. The second voltage source terminal of the lowest-stage battery-voltage monitoring integrated-circuit is connected to the one voltage source terminal.

A battery-voltage monitoring system according to still another aspect of the present invention includes a first integrated-circuit including a first voltage source terminal that is connected to a maximum voltage terminal of a specified-number of serially-connected secondary batteries to be monitored, a first voltage being input to the first voltage source terminal, a second voltage source terminal that is connected to a minimum voltage terminal of the secondary batteries to be monitored, a second voltage being input to the second voltage source terminal, a first input terminal to which a first control signal is input, a first reference-voltage generating unit that receives the first voltage and the second voltage as operating voltages, and generates a first reference voltage, a first voltage converting unit that receives the first control signal, and converts the first control signal received into either the first reference voltage or the second voltage, and a first reference-voltage output terminal that outputs the first reference voltage; a second integrated-circuit including a third voltage source terminal that is connected to a maximum voltage terminal of the secondary batteries to be monitored, a third voltage being input to the third voltage source terminal, a fourth voltage source terminal that is connected to a minimum voltage terminal of the secondary batteries to be monitored, a fourth voltage being input to the fourth voltage source terminal, a second input terminal to which a second control signal is input, a second reference-voltage generating unit that receives the third voltage and the fourth voltage as operating voltages, and generates a second reference voltage, a second voltage converting unit that receives the second control signal, and converts the second control signal received into either the second reference voltage or the fourth voltage, a control unit that controls a supply of the second control signal converted by the second voltage converting unit to a first output terminal with the second reference voltage, and a second reference-voltage output terminal that outputs the second reference voltage; and a control circuit including a second output terminal, one voltage source terminal, and other voltage source terminal. The first integrated-circuit is serially-connected to an upper stage of the second integrated-circuit. The second voltage source terminal is connected to the third voltage source terminal. The output terminal is connected to the first reference-voltage output terminal via a resistive potential-dividing circuit. A divided-voltage output terminal of the resistive potential-dividing circuit is connected to the second input terminal. The second input terminal of a lowest-stage battery-voltage monitoring integrated-circuit is connected to the second output terminal. The fourth voltage source terminal of the lowest-stage second integrated-circuit is connected to the one voltage source terminal.

A battery-voltage monitoring system according to still another aspect of the present invention includes at least two battery-voltage monitoring integrated-circuits serially-connected from an upper stage to a lower stage, including a first voltage source terminal that is connected to a maximum voltage terminal of a specified-number of serially-connected secondary batteries to be monitored, a first voltage being input to the first voltage source terminal, a second voltage source terminal that is connected to a minimum voltage terminal of the secondary batteries to be monitored, a second voltage being input to the second voltage source terminal, an input terminal to which a control signal is input, a reference-voltage generating unit that receives the first voltage and the second voltage as operating voltages, and generates a reference voltage, a voltage converting unit that receives the control signal, and converts the control signal received into either the reference voltage or the second voltage, a control unit that controls a supply of the control signal converted by the voltage converting unit to a first output terminal with the reference voltage, and a reference-voltage output terminal that outputs the reference voltage; and a control circuit including a second output terminal, one voltage source terminal, and other voltage source terminal. The second voltage source terminal of an upper-stage battery-voltage monitoring integrated-circuit is connected to the first voltage source terminal of a lower-stage battery-voltage monitoring integrated-circuit. The first output terminal of the lower-stage battery-voltage monitoring integrated-circuit is connected to the first reference-voltage output terminal of the upper-stage battery-voltage monitoring integrated-circuit via a resistive potential-dividing circuit. A divided-voltage output terminal of the resistive potential-dividing circuit is connected to the input terminal of the upper-stage battery-voltage monitoring integrated-circuit. The input terminal of a lowest-stage battery voltage monitoring circuit is connected to the second output terminal. The second voltage source terminal of the lowest-stage battery voltage monitoring circuit is connected to the one voltage source terminal.

A battery-voltage monitoring system a first battery-voltage monitoring integrated-circuit including a first voltage source terminal that is connected to a maximum voltage terminal of a specified-number of serially-connected secondary batteries to be monitored, a first voltage being input to the first voltage source terminal, a second voltage source terminal that is connected to a minimum voltage terminal of the secondary batteries to be monitored, a second voltage being input to the second voltage source terminal, a battery-voltage detecting unit that outputs a detection signal based on a result of a voltage monitoring of each of the secondary batteries, a first reference-voltage generating unit that receives the first voltage and the second voltage as operating voltages, and generates a first reference voltage, a first voltage converting unit that receives the detection signal, and converts the detection signal received into either the first reference voltage or the second voltage, a first output terminal that outputs the detection signal converted by the first voltage converting unit as an output detection signal, a first input terminal to which a first control signal is input, a second voltage converting unit that receives the first control signal, and converts the first control signal received into either the first reference voltage or the second voltage, and a first reference-voltage output terminal that outputs the first reference voltage; at least one second battery-voltage monitoring integrated-circuit including a third voltage source terminal that is connected to a maximum voltage terminal of the secondary batteries to be monitored, a third voltage being input to the third voltage source terminal, a fourth voltage source terminal that is connected to a minimum voltage terminal of the secondary batteries to be monitored, a fourth voltage being input to the fourth voltage source terminal, a second input terminal to which an output detection signal is input, a second reference-voltage generating unit that receives the first voltage and the second voltage as operating voltages, and generates a second reference voltage, a third reference-voltage generating unit that receives the first voltage and the second voltage as operating voltages, and generates a third reference voltage, a second voltage converting unit that receives the output detection signal, and converts the output detection signal received into either the second reference voltage or the fourth voltage, a second reference-voltage output terminal that outputs the second reference voltage, a second output terminal that outputs the output detection signal converted by the first voltage converting unit as an output detection signal, a third input terminal to which a second control signal is input, a third voltage converting unit that receives the second control signal, and converts the second control signal received into either the second reference voltage or the fourth voltage, a control unit that controls a supply of the second control signal converted by the third voltage converting unit to a third output terminal with the third reference voltage, and a second reference-voltage output terminal that outputs the second reference voltage; and a control circuit including a fourth input terminal, a fourth output terminal, one voltage source terminal, and other voltage source terminal. The second battery-voltage monitoring integrated-circuit is connected to a lower stage of the first battery-voltage monitoring integrated-circuit. The second voltage source terminal is connected to the third voltage source terminal. The first output terminal is connected to the third reference-voltage output terminal via a first resistive potential-dividing circuit. A first divided-voltage output terminal of the first resistive potential-dividing circuit is connected to the second input terminal. The third output terminal is connected to the first reference-voltage output terminal via a second resistive potential-dividing circuit. A second divided-voltage output terminal of the second resistive potential-dividing circuit is connected to the first input terminal. The second output terminal of a lowest-stage battery-voltage monitoring integrated-circuit is connected to the fourth input terminal. The third input terminal of the lowest-stage battery-voltage monitoring integrated-circuit is connected to the fourth output terminal. The fourth voltage source terminal of the lowest-stage battery-voltage monitoring integrated-circuit is connected to the one voltage source terminal.

A battery-voltage monitoring system according to still another aspect of the present invention includes at least two battery-voltage monitoring integrated-circuits serially-connected from an upper stage to a lower stage, including a first voltage source terminal that is connected to a maximum voltage terminal of a specified-number of serially-connected secondary batteries to be monitored, a first voltage being input to the first voltage source terminal, a second voltage source terminal that is connected to a minimum voltage terminal of the secondary batteries to be monitored, a second voltage being input to the second voltage source terminal, a first input terminal to which an output detection signal is input, a first reference-voltage generating unit that receives the first voltage and the second voltage as operating voltages, and generates a first reference voltage, a second reference-voltage generating unit that receives the first voltage and the second voltage as operating voltages, and generates a second reference voltage, a first voltage converting unit that receives the output detection signal, and converts the output detection signal received into either the first reference voltage or the second voltage, a second reference-voltage output terminal that outputs the second reference voltage, a first output terminal that outputs the output detection signal converted by the first voltage converting unit as an output detection signal, a second input terminal to which a control signal is input, a second voltage converting unit that receives the control signal, and converts the control signal received into either the first reference voltage or the second voltage, a control unit that controls a supply of the control signal converted by the second voltage converting unit to a second output terminal with the second reference voltage, and a first reference-voltage output terminal that outputs the first reference voltage; a control circuit including a third input terminal, a third output terminal, one voltage source terminal, and other voltage source terminal. The second voltage source terminal of an upper-stage battery-voltage monitoring integrated-circuit is connected to the first voltage source terminal of a lower-stage battery-voltage monitoring integrated-circuit. The first output terminal of the upper-stage battery-voltage monitoring integrated-circuit is connected to the second reference-voltage output terminal of the lower-stage battery-voltage monitoring integrated-circuit via a first resistive potential-dividing circuit. A first divided-voltage output terminal of the first resistive potential-dividing circuit is connected to the first input terminal of the lower-stage battery-voltage monitoring integrated-circuit. The second output terminal of the lower-stage battery-voltage monitoring integrated-circuit is connected to the first reference-voltage output terminal of the upper-stage battery-voltage monitoring integrated-circuit via a second resistive potential-dividing circuit. A second divided-voltage output terminal of the second resistive potential-dividing circuit is connected to the second input terminal of the upper-stage battery-voltage monitoring integrated-circuit. The first output terminal of a lowest-stage battery-voltage monitoring integrated-circuit is connected to the third input terminal. The second input terminal of the lowest-stage battery-voltage monitoring integrated-circuit is connected to the third output terminal. The second voltage source terminal of the lowest-stage battery-voltage monitoring integrated-circuit is connected to the one voltage source terminal.

A battery-voltage monitoring system according to still another aspect of the present invention includes at least two battery-voltage monitoring integrated-circuits serially-connected from an upper stage to a lower stage, including a first voltage source terminal that is connected to a maximum voltage terminal of a specified-number of serially-connected secondary batteries to be monitored, a first voltage being input to the first voltage source terminal, a second voltage source terminal that is connected to a minimum voltage terminal of the secondary batteries to be monitored, a second voltage being input to the second voltage source terminal, a clock input terminal to which a clock signal is input, a data input terminal to which a data signal is input, a first reference-voltage generating unit that receives the first voltage and the second voltage as operating voltages, and generates a first reference voltage, a second reference-voltage generating unit that receives the first voltage and the second voltage as operating voltages, and generates a second reference voltage, a first voltage converting unit that receives the clock signal, and converts the clock signal received into either the first voltage or the second voltage, a second voltage converting unit that receives the data signal, and converts the data signal received into either the first voltage or the second voltage, a flip-flop that accepts the data signal converted by the second voltage converting unit according to the clock signal converted by the first voltage converting unit, a third voltage converting unit that the clock signal converted by the first voltage converting unit, and converts the clock signal converted by the first voltage converting unit received into either the first voltage or the second voltage, a fourth voltage converting unit that receives the data signal converted by the second voltage converting unit, and converts the data signal converted by the second voltage converting unit received into either the first voltage or the second voltage, a first control unit that controls a supply of the clock signal converted by the third voltage converting unit to a clock output terminal with the second reference voltage, a second control unit that controls a supply of the data signal converted by the fourth voltage converting unit to a data output terminal with the second reference voltage, and a reference-voltage output terminal that outputs the first reference voltage; and a control circuit including a clock output terminal, a data output terminal, one voltage source terminal, and other voltage source terminal. The second voltage source terminal of an upper-stage battery-voltage monitoring integrated-circuit is connected to the first voltage source terminal of a lower-stage battery-voltage monitoring integrated-circuit. The clock output terminal of the lower-stage battery-voltage monitoring integrated-circuit is connected to the first reference voltage source output terminal of the upper-stage battery-voltage monitoring integrated-circuit via a first resistive potential-dividing circuit. A first divided-voltage output terminal of the first resistive potential-dividing circuit is connected to the clock input terminal of the upper-stage battery-voltage monitoring integrated-circuit. The data output terminal of the lower-stage battery-voltage monitoring integrated-circuit is connected to the first reference-voltage output terminal of the upper-stage battery-voltage monitoring integrated-circuit via a second resistive potential-dividing circuit. A second divided-voltage output terminal of the second resistive potential-dividing circuit is connected to the data input terminal of the upper-stage battery-voltage monitoring integrated-circuit. The clock input terminal of a lowest-stage battery-voltage monitoring integrated-circuit is connected to the clock output terminal. The data input terminal of the lowest-stage battery-voltage monitoring integrated-circuit is connected to the data output terminal. The second voltage source terminal of the lowest-stage battery-voltage monitoring integrated-circuit is connected to the one voltage source terminal.

The other objects, features, and advantages of the present invention are specifically set forth in or will become apparent from the following detailed description of the invention when read in conjunction with the accompanying drawings.

DETAILED DESCRIPTION

Exemplary embodiment of a battery-voltage monitoring integrated-circuit and a battery-voltage monitoring system according to the present invention are explained in detail with reference to the accompanying drawings.

Figure 1:
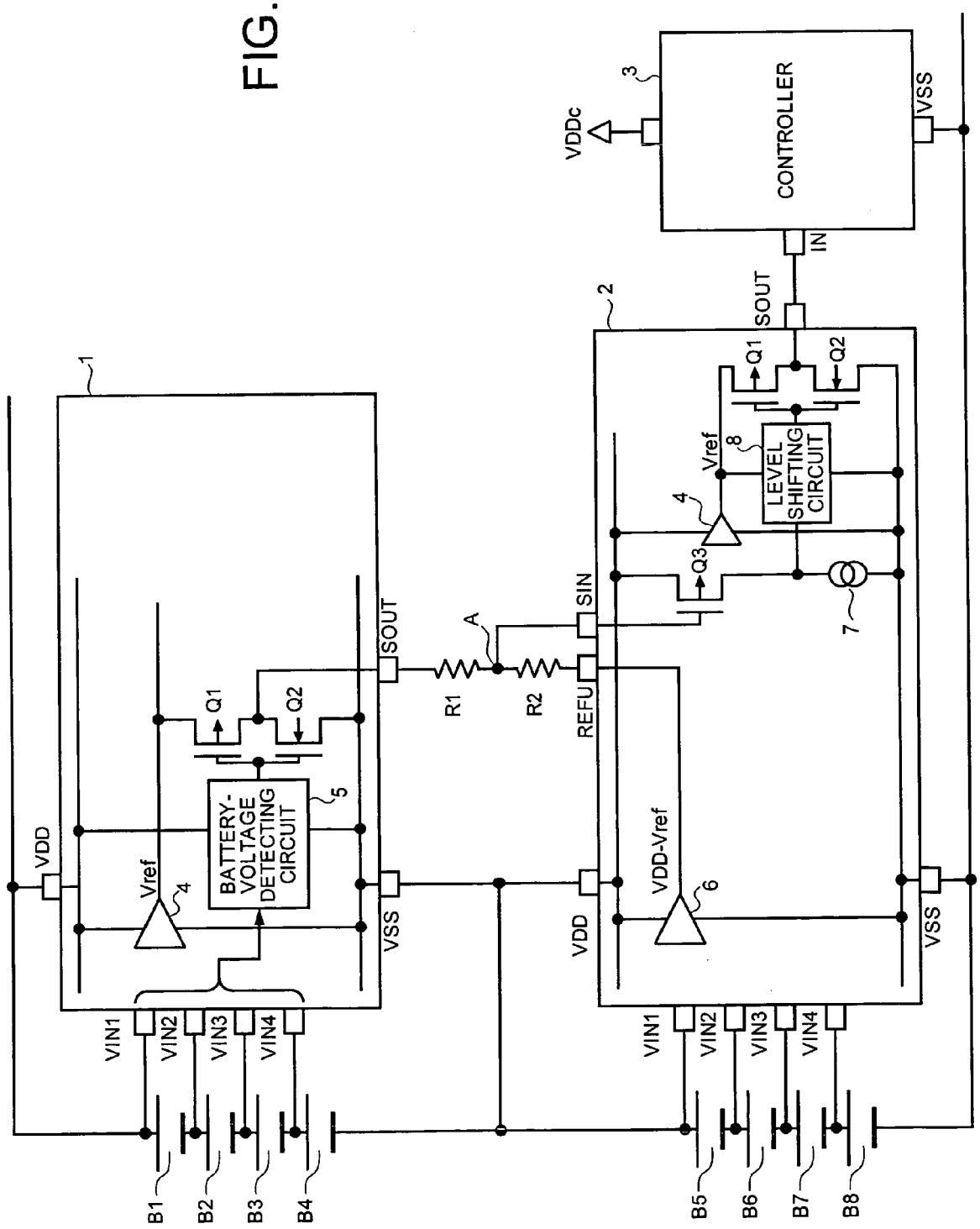
FIG. 1 is a circuit diagram of relevant parts of a battery-voltage monitoring system according to a first embodiment of the present invention.

FIG. 1 is a circuit diagram of the relevant parts of the battery-voltage monitoring system according to a first embodiment of the present invention. According to the present invention, the battery-voltage monitoring integrated-circuit can be treated as a single unit of a specific number of serially-connected lithium-ion batteries connected. According to the first embodiment as well as the other embodiments that follow, it is assumed that the battery-voltage monitoring integrated-circuit treats as a single unit four serially-connected lithium-ion battery cells. The battery-voltage monitoring integrated-circuit is made taking into account the fact that the material can withstand up to a relatively low voltage of 30 V. The battery-voltage monitoring integrated-circuit shall hereinafter be referred to as "integrated-circuit".

The first embodiment is explained by taking an example of a minimum possible stacking of two integrated-circuits. In other words, since a single integrated-circuit monitors four serially connected battery cells, according to the first embodiment of the battery-voltage monitoring system that serves as a transmission channel by monitoring eight serially-connected battery cells and transmitting a battery cell error detected an upper integrated-circuit 1 to a control circuit (hereinafter, "controller") 3 via a lower integrated-circuit 2.

The basic structure of the first embodiment is explained first. In FIG. 1, the upper integrated-circuit 1 and the lower integrated-circuit 2 each has a VDD terminal, which is a maximum potential terminal, and a VSS terminal, which is a minimum potential terminal. The VSS terminal of the upper integrated-circuit 1 and the VDD terminal of the lower integrated-circuit 2 are connected to each other.

There are eight serially-connected battery cells B1 through B8. The positive terminal of the topmost battery cell B1 is connected to the VDD terminal of the upper integrated-circuit 1, and the negative terminal of the bottommost battery cell B8 is connected to the VSS terminal of the lower integrated-circuit 2. The negative terminal of the bottommost battery cell B4 of the upper four battery cells B1 through B4 and the positive terminal of the topmost battery cell B5 of the lower four battery cells B5 through B8 are commonly connected to the VSS terminal of the upper integrated-circuit 1 and the VDD terminal of the lower integrated-circuit 2.

A battery-voltage detecting circuit 5 of the upper integrated-circuit 1 has four voltage monitoring terminals VIN1 through VIN4, which are monitored voltage input terminals. The positive terminals of the four serially-connected battery cells B1 through B4 are connected to the corresponding voltage monitoring terminals VIN1 through VIN4. Similarly, a not shown battery-voltage detecting circuit of the lower integrated-circuit 2 has four voltage monitoring terminals VIN1 through VIN4, which are monitored voltage input terminals. The positive terminals of the four serially-connected battery cells B5 through B8 are connected to the corresponding voltage monitoring terminals VIN1 through VIN4. The battery-voltage detecting circuit 5 takes the VDD terminal and the VSS terminal as the operating power sources and outputs a detection signal having a voltage that corresponds to the result obtained from monitoring the voltages of the battery cells B1 through B4.

To serve as a transmission channel, the upper integrated-circuit 1 includes a reference voltage source 4 that generates a first reference voltage Vref based on the maximum potential VDD and the minimum potential VSS, a CMOS inverter (Q1, Q2) disposed between the output terminal of the reference voltage source 4 and the VSS terminal, and that receives the signal output from the battery-voltage detecting circuit 5, and a signal output terminal SOUT which receives the signal output from the CMOS inverter (Q1, Q2).

Transistor Q1 of the CMOS inverter (Q1, Q2) is a PMOS transistor. The source electrode of the transistor Q1 is connected to the output terminal of the reference voltage source 4. Transistor Q2 is an NMOS transistor. The source electrode of the transistor Q2 is connected to the VSS terminal. The gate electrodes of the transistors Q1 and Q2 are connected to each other to form an input terminal, which in turn is connected to the output terminal of the battery-voltage detecting circuit 5. The drain electrodes of the transistors Q1 and Q2 are connected to each other to form an output terminal, which in turn is connected to the signal output terminal SOUT.

The lower integrated-circuit 2 includes a reference voltage source 6 that generates a second reference voltage VDD-Vref based on the maximum potential VDD and the minimum potential VSS, a reference voltage terminal REFU which receives the signal output from the reference voltage source 6, a signal input terminal SIN, a transistor Q3 whose gate electrode is connected to the signal input terminal SIN, a constant current circuit 7, the reference voltage source 4 that generates the first reference voltage Vref based on the maximum potential VDD and the minimum potential VSS, a level shifting circuit 8 disposed between the output terminal of the reference voltage source 4 and the VSS terminal, a CMOS inverter (Q1, Q2) disposed between the output terminal of the reference voltage source 4 and the VSS terminal, and a signal output terminal SOUT that receives the signal output from the CMOS inverter (Q1, Q2).

The transistor Q3 is a PMOS transistor. The source electrode of the transistor Q3 is connected to the VDD terminal and the drain electrode is connected to the VSS terminal via the constant current circuit 7. The connection terminal between the transistor Q3 and the constant current circuit 7 is connected to the input terminal of the level shifting circuit 8. The output terminal of the level shifting circuit 8 is connected to the input terminal of the CMOS inverter (Q1, Q2).

The signal output terminal SOUT of the upper integrated-circuit 1 and the reference voltage source REFU of the lower integrated-circuit 2 are connected by means of a resistive potential-dividing circuit (represented in FIG. 1 by serially-connected resistors R1 and R2). A potential divider output terminal A of the resistive potential-dividing circuit (R1, R2) is connected to the signal input terminal SIN of the lower integrated-circuit 2.

The signal output terminal SOUT of the lower integrated-circuit 2 is connected to a signal input terminal IN of the controller 3. The VSS terminal of lower integrated-circuit 2 and the VSS terminal of the controller 3 are connected to each other. The maximum potential at a VDDc terminal of the controller 3 is 3.3 V.

Figure 2:
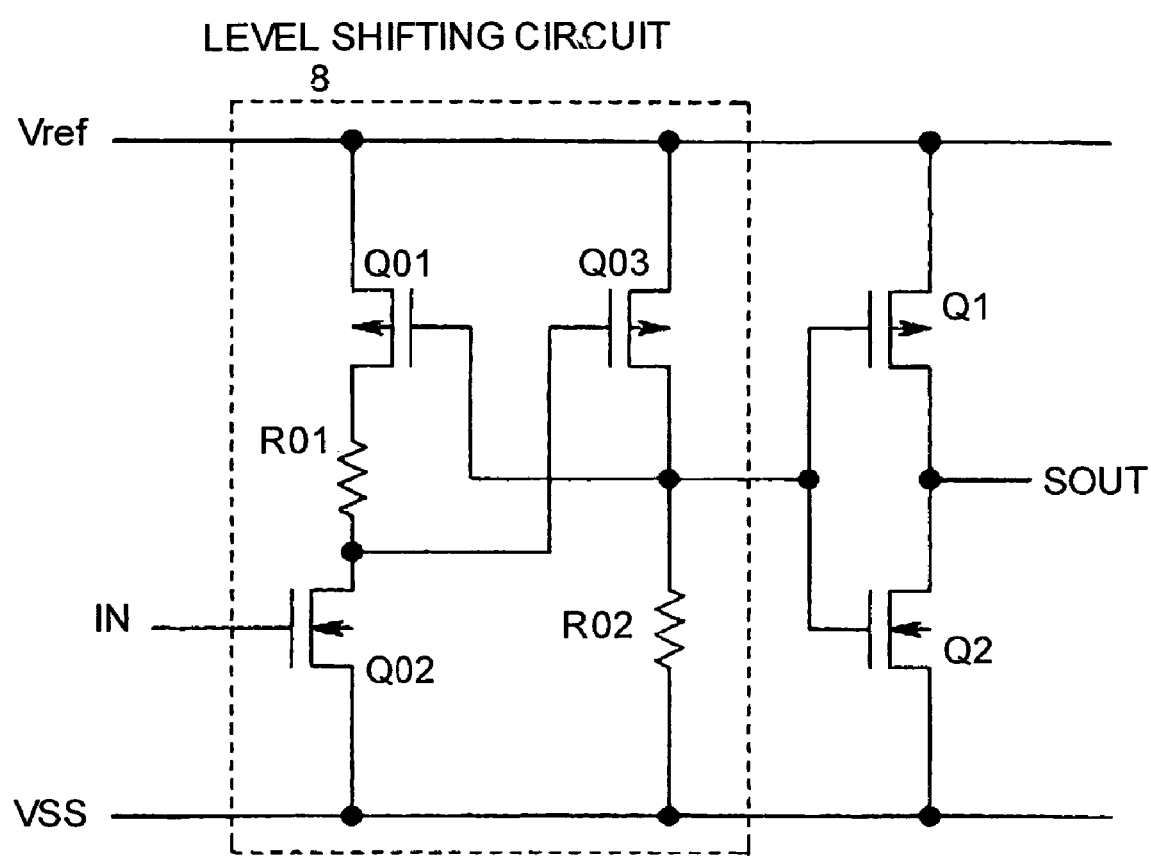
FIG. 2 is a circuit diagram of a level shifting circuit shown in FIG. 1.

FIG. 2 is a circuit diagram of the level shifting circuit 8. The CMOS inverter (Q1, Q2) is also shown alongside the circuit diagram of the level shifting circuit 8 in FIG. 2. The source electrodes of PMOS transistors Q01, Q03 are connected to the output terminal (the first reference voltage Vref) of the reference voltage source 4. The drain electrode of the PMOS transistor Q01 is connected to the drain electrode of an NMOS transistor Q02 by means of a resistor R01, and the source electrode of the NMOS transistor Q02 is connected to the VSS terminal. The drain electrode of the PMOS transistor Q03 is connected to the VSS terminal by means of a resistor R02. The gate electrode of the NMOS transistor Q02 is the signal input terminal to which the connection terminal between the transistor Q3 and the constant current circuit 7 is connected. The gate electrode of the PMOS transistor Q01 is connected to the connection terminal between the drain electrode of the PMOS transistor Q03 and the resistor R02, and the input terminal of the CMOS inverter (Q1, Q2). The gate electrode of the PMOS transistor Q03 is connected to the drain electrode of the NMOS transistor Q02.

In the level shifting circuit 8 shown in FIG. 2, when the NMOS transistor Q02 is off, the potential at the connection terminal between the drain electrode of the PMOS transistor Q03 and the resistor R02 is substantially the potential at the VSS terminal. This induces both the PMOS transistors Q01 and Q03 to turn on and continue to maintain the potential at the VSS terminal at the connection terminal between the drain electrode of the PMOS transistor Q03 and the resistor 02. This causes the voltage of the signal output from the CMOS inverter (Q1, Q2) to be the same as the first reference voltage Vref. When the NMOS transistor Q02 is turned on, the PMOS transistor Q03 is turned on but the PMOS transistor Q01 is turned off, maintaining the potential at the connection terminal between the drain electrode of the PMOS transistor Q03 and the resistor R02 at the first reference voltage Vref. In this way, the signal output from the CMOS inverter (Q1, Q2) has the minimum potential VSS.

Figure 3A:
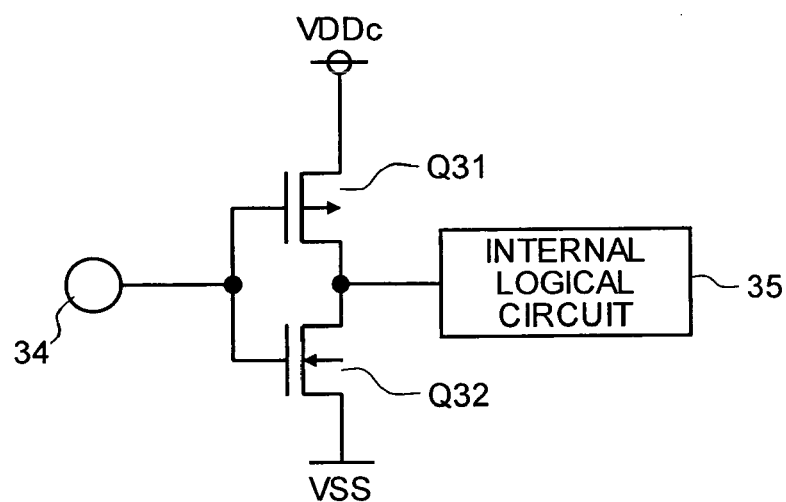
FIG. 3A is a first example of a structure of an input stage of a controller.
Figure 3B:
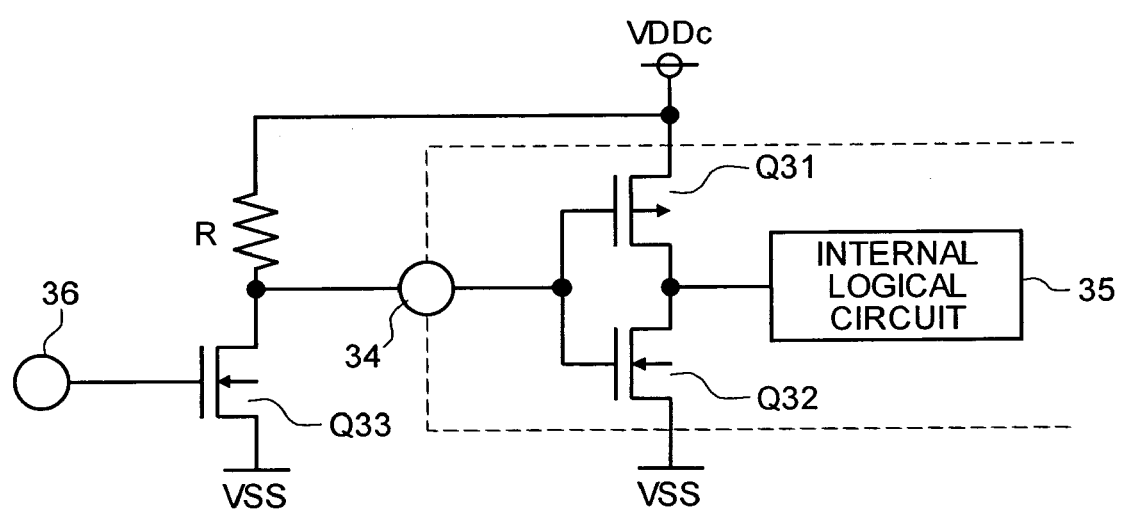
FIG. 3B is a second example of the structure of the input stage of the controller.

FIG. 3A is a first example of a structure of an input stage of the controller 3. FIG. 3B is a second example of the structure of the input stage of the controller 3.

In FIG. 3A, a CMOS inverter (Q31, Q32) is disposed between the VDDc terminal and the VSS terminal of the controller 3. The input terminal of the CMOS inverter (Q31, Q32) is connected to an input terminal 34, and the output terminal of the CMOS inverter (Q31, Q32) is connected to an internal logical circuit 35. The CMOS inverter (Q31, Q32) changes the voltage of the signal impressed on the input terminal 34 from the signal output terminal SOUT of the lower integrated-circuit 2 to the maximum potential VDDc voltage and the minimum potential VSS, and outputs the signal to the internal logical circuit 35.

The voltage of the signal impressed on the input terminal 34 may be either the first reference voltage Vref or the minimum potential VSS. If there is a major difference between the first reference voltage Vref and the maximum potential VDDc (3.3 V, for instance), this can be rectified by externally adding a circuit (consisting of an NMOS transistor Q33, and a resistor R) for level changing, as shown in FIG. 3B.

In other words, in FIG. 3B, the source electrode of the NMOS transistor Q33 is connected to the VSS terminal and the drain electrode is connected to the VDDc terminal by means of the resistor R. The connection terminal of the drain electrode of the NMOS transistor Q33 and the resistor R is connected to the input terminal 34. The gate electrode of the NMOS transistor Q33 becomes a new input terminal 36 on which the signal from the signal output terminal SOUT of the lower integrated-circuit 2 is impressed. Since this structure uses a reverse logic, either one more step of CMOS inverter may be provided or reversed polarity may be recognized with the aid of the internal logical circuit 35 of the controller.

The functioning of the battery-voltage monitoring system according to the first embodiment is explained next. The battery-voltage detecting circuit 5 of the upper integrated-circuit 1 monitors the voltage of each of the battery cells B1 through B4, and when any battery cell shows signs of over-charging or over-discharging, changes voltage of the output signal (high level=Vref or low level=VSS) to a level corresponding to the degree of mal-charging. Thus, the CMOS inverter (Q1, Q2) changes the voltage of the output signal at the signal output terminal SOUT to either the first reference voltage Vref or the minimum potential VSS.

When the level-shifted signal is impressed on the signal output terminal SOUT, the resistive potential-dividing circuit, consisting of the serially-connected resistors R1 and R2, generates at the potential divider output terminal A voltage obtained by dividing the potential level of the signal output terminal SOUT of the upper integrated-circuit 1 (first reference voltage Vref level or VSS terminal level) and the second reference voltage VDD-Vref of the reference voltage terminal REFU of the lower integrated-circuit 2. The divided potentials are obtained by means of the following expressions. To make the explanation easy to understand, the resistors R1 and R2 are assumed to have the same resistance (R1=R2).

When the voltage of the signal output from the CMOS inverter (Q1, Q2) of the upper integrated-circuit 1 is the same as the first reference voltage Vref, the voltage generated at the potential divider output terminal A is calculated by $$[\{(VDD+Vref)-(VDD-Vref)\} \times R2/(R1+R2)]+(VDD-Vref)=VDD \quad (1)$$

When the voltage of the signal output from the CMOS inverter (Q1, Q2) of the upper integrated-circuit 1 is the same as the minimum potential VSS, the voltage generated at the potential divider output terminal A is calculated by $$[\{VDD-(VDD-Vref)\} \times R2/(R1+R2)]+(VDD-Vref)=VDD-Vref/2 \quad (2)$$

In this way, the voltage generated at the potential divider output terminal A is impressed on the gate electrode of the transistor Q3 in the lower integrated-circuit 2. Here, the magnitude correlation between the first reference voltage Vref and a threshold voltage Vth when the transistor Q3 is turned on is taken as Vref/2>Vth.

When the voltage of the signal output from the CMOS inverter (Q1, Q2) of the upper integrated-circuit 1 is the same as the first reference voltage Vref level, as indicated by Eq. (1), the maximum potential VDD is impressed on the gate electrode of the transistor Q3 of the lower integrated-circuit 2. Consequently, the transistor Q3 is turned off. When the voltage of the signal output from the CMOS inverter (Q1, Q2) of the upper integrated-circuit 1 is the same as the VSS terminal level, as indicated by Eq. (2), a voltage obtained by subtracting half of the first reference voltage Vref from the maximum potential VDD is impressed on the gate electrode of the transistor Q3 of the lower integrated-circuit 2. Consequently, the transistor Q3 is turned on.

The voltage at the drain electrode of the transistor Q3 of the lower integrated-circuit 2 is pulled down by the constant current circuit 7. Consequently, when the transistor Q3 is turned on/off, the level shifting circuit 8 changes the potential of the signal at the drain electrode to the VSS terminal reference potential. This level-shifted signal is output from the signal output terminal SOUT of the lower integrated-circuit 2 via the CMOS inverter (Q1, Q2). At the output terminal SOUT, the voltage of the output signal is either the first reference voltage or the minimum potential VSS.

Since the minimum potential level of the controller 3 is the same level as the minimum potential VSS of the lower integrated-circuit 2, the controller 3 receives the signal output from the signal output terminal SOUT of the lower integrated-circuit 2 as is and processes it.

Thus, according to the first embodiment of the battery-voltage monitoring system built by stacking a minimum number of two integrated-circuits one on top of the other, any cell mal-charging detected in the upper integrated-circuit is transmitted to the controller via the lower integrated-circuit.

Figure 4:
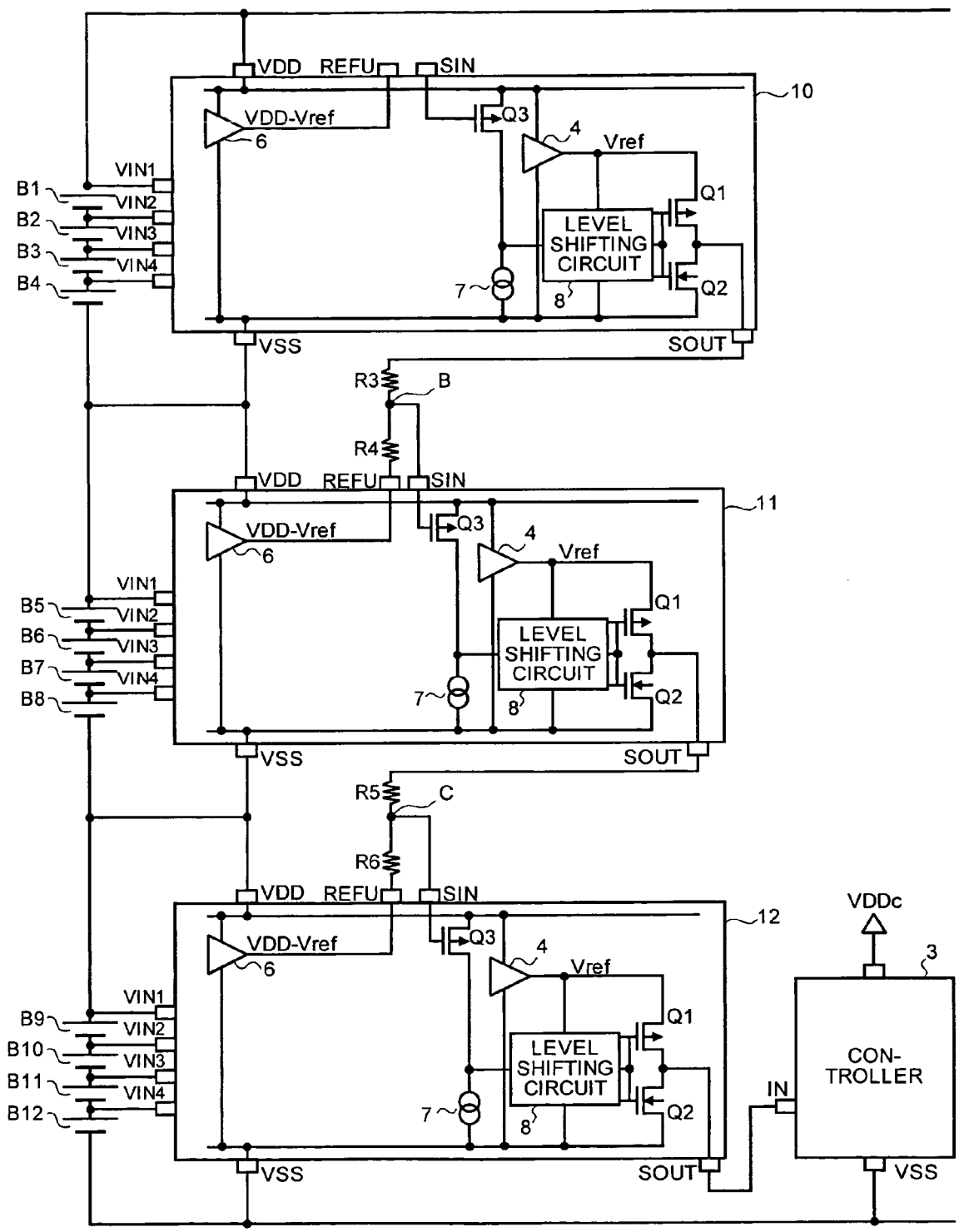
FIG. 4 is a circuit diagram of relevant parts of the battery-voltage monitoring system according a second embodiment of the present invention.

FIG. 4 is a circuit diagram of the relevant parts of the battery-voltage monitoring system according to a second embodiment of the present invention. The parts in FIG. 4 that are the same as or equivalent to those in FIG. 1 have been assigned the same reference symbols or reference numerals. According to the second embodiment, the battery-voltage monitoring system is built as a three-level structure, having a topmost integrated-circuit, an intermediate integrated-circuit, and a bottommost integrated-circuit, all having an identical structure, and as a transmission channel that outputs any mal-charging in the topmost integrated-circuit to the bottommost integrated-circuit via the intermediate integrated-circuit, and from the bottommost integrated-circuit to the controller.

In FIG. 4, three integrated-circuits 10, 11, and 12, stacked one on top of another, form the battery-voltage monitoring system. All or some of the integrated-circuits 10, 11, and 12 shown in FIG. 4 can replace the lower integrated-circuit 2 shown in the two-level battery-voltage monitoring system according to the first embodiment.

In FIG. 4, a topmost integrated-circuit 10, an intermediate integrated-circuit 11, and a bottommost integrated-circuit 12 each has a VDD terminal, which is a maximum potential terminal, and a VSS terminal, which is a minimum potential terminal. The VSS terminal of the topmost integrated-circuit 10 is connected to the VDD terminal of the intermediate integrated-circuit 11, and the VSS terminal of the intermediate integrated-circuit 11 is connected to the VDD terminal of the bottommost integrated-circuit 12.

There are 12 serially-connected battery cells B1 through B12. The positive terminal of the topmost battery cell B1 is connected to the VDD terminal of the topmost integrated-circuit 10, and the negative terminal of the bottommost battery cell B12 is connected to the VSS terminal of the bottommost integrated-circuit 12. The positive terminal of the bottommost battery cell B4 of the top four battery cells B1 through B4 and the negative terminal of the topmost battery cell B5 of the middle four battery cells B5 through B8 are commonly connected to the VSS terminal of the topmost integrated-circuit 10 and the VDD terminal of the intermediate integrated-circuit 11. The positive terminal of the bottommost battery cell B8 of the middle four battery cells B5 through B8 and the negative terminal of the topmost battery cell B9 of the bottom four battery cells B9 through B12 are commonly connected to the VSS terminal of the intermediate integrated-circuit 11 and the VDD terminal of the bottommost integrated-circuit 12.

A not shown battery-voltage detecting circuit of the topmost integrated-circuit 10 has four voltage monitoring terminals VIN1 through VIN4, which are monitored voltage input terminals. The positive terminals of the top four serially-connected battery cells B1 through B4 are connected to the corresponding voltage monitoring terminals VIN1 through VIN4. Similarly, a not shown battery-voltage detecting circuit of the intermediate integrated-circuit 11 has four voltage monitoring terminals VIN1 through VIN4, which are monitored voltage input terminals. The positive terminals of the middle four serially-connected battery cells B5 through B8 are connected to the corresponding voltage monitoring terminals VIN1 through VIN4. Likewise, a not shown battery-voltage detecting circuit of the bottommost integrated-circuit 12 has four voltage monitoring terminals VIN1 through VIN4, which are monitored voltage input terminals. The positive terminals of the bottom four serially-connected battery cells B9 through B12 are connected to the corresponding voltage monitoring terminals VIN1 through VIN4.

Each of the three integrated-circuits 10, 11, and 12 has the same structure as the lower integrated-circuit 2 shown in FIG. 1. In other words, to serve as a transmission channel, each of the three integrated-circuits 10, 11, and 12 includes the reference voltage source 6 that generates a second reference voltage VDD-Vref based on the maximum potential VDD and the minimum potential VSS, the reference voltage terminal REFU which receives the signal output from the reference voltage source 6, the signal input terminal SIN, the transistor Q3 whose gate electrode is connected to the signal input terminal SIN, the constant current circuit 7 disposed between the drain electrode of the transistor Q3 and the VSS terminal, the reference voltage source 4 that generates the first reference voltage Vref based on the maximum potential VDD and the minimum potential VSS, the level shifting circuit 8 disposed between the output terminal of the reference voltage source 4 and the VSS terminal and that receives input of potential level of the connection terminal between the transistor Q3 and the constant current circuit 7, the CMOS inverter (Q1, Q2) disposed between the output terminal of the reference voltage source 4 and the VSS terminal, and the signal output terminal SOUT that receives the signal output from the CMOS inverter (Q1, Q2).

The signal output terminal SOUT of the topmost integrated-circuit 10 and the reference voltage source REFU of the intermediate integrated-circuit 11 are connected by means of a resistive potential-dividing circuit (represented in FIG. 4 by serially-connected resistors R3 and R4). A potential divider output terminal B of the resistive potential-dividing circuit (R3,R4) is connected to the signal input terminal SIN of the intermediate integrated-circuit 11.

The signal output terminal SOUT of the intermediate integrated-circuit 11 and the reference voltage source REFU of the bottommost integrated-circuit 12 are connected by means of a resistive potential-dividing circuit (represented in FIG. 4 by serially-connected resistors R5 and R6). A potential divider output terminal C of the resistive potential-dividing circuit (R5,R6) is connected to the signal input terminal SIN of the bottommost integrated-circuit 12.

The signal output terminal SOUT of the bottommost integrated-circuit 12 is connected to the signal input terminal IN of the controller 3. The VSS terminal of bottommost integrated-circuit 12 and the VSS terminal of the controller 3 are connected to each other.

The functioning of the battery-voltage monitoring system according to the second embodiment is explained next. The not shown battery-voltage detecting circuit of the topmost integrated-circuit 10 monitors the voltage of each of the battery cells B1 through B4, and when any battery cell shows signs of over-charging or over-discharging, as explained with reference to FIG. 1, the CMOS inverter (Q1, Q2) changes the voltage of the output signal at the signal output terminal SOUT to either the first reference voltage Vref or the minimum voltage VSS.

To explain according to the second embodiment with reference to the structure shown in FIG. 4, one could consider that the resistive potential-dividing circuit consisting of the serially connected resistors R1 and R2 shown in FIG. 1 is connected to the signal input terminal SIN. However, since this consideration leads to inconsistency in the number of battery cells being represented and the reference symbols assigned to the battery cells being monitored, let us consider that the resistive potential-dividing circuit is not connected. To sum up, the three integrated-circuits 10, 11, and 12 can be considered to replace the lower integrated-circuit 2 of the two-level battery-voltage monitoring system according to the first embodiment.

In this case, as explained according to the first embodiment, when the transistor Q3 is turned on/off, the level shifting circuit 8 changes the potential of the signal at the drain electrode to the VSS terminal reference potential. This level-shifted signal is output from the signal output terminal SOUT of the lower integrated-circuit 2 via the CMOS inverter (Q1, Q2). At the output terminal SOUT, the voltage of the output signal is either the first reference voltage Vref or the minimum potential VSS.

The resistive voltage dividing circuit, consisting of the serially-connected resistors R3 and R4, generates at a potential divider output terminal B a voltage obtained by dividing the potential level (first reference voltage Vref or minimum potential VSS) of the signal output terminal SOUT of the topmost integrated-circuit 10 and the second reference voltage VDD-Vref of the reference voltage terminal REFU of the intermediate integrated-circuit 11. The divided potentials are obtained by means of the following expressions. To make the explanation easy to understand, the resistors R3 and R4 are assumed to have the same resistance (R3=R4).

When the voltage of the signal output from the CMOS inverter (Q1, Q2) of the topmost integrated-circuit 10 is the same as the first reference voltage Vref, and if the minimum potential VSS of the intermediate integrated-circuit 11 is considered as reference, the voltage generated at the potential divider output terminal B is calculated by $$[\{(VDD+Vref)-(VDD-Vref)\} \times R3/(R3+R4)]+(VDD-Vref)=VDD \quad (3)$$

When the voltage of the signal output from the CMOS inverter (Q1, Q2) of the topmost integrated-circuit 10 is the same as the minimum voltage VSS, and if the minimum voltage VSS of the topmost integrated-circuit 10 is considered as reference, the voltage generated at the potential divider output terminal B is calculated by $$[\{VDD-(VDD-Vref)\} \times R3/(R3+R4)]+(VDD-Vref)=VDD-Vref/2 \quad (4)$$

In this way, the voltage generated at the potential divider output terminal B is impressed on the gate electrode of the transistor Q3 of the intermediate integrated-circuit 11. Here, the magnitude correlation between the first reference voltage Vref and the threshold voltage Vth when the transistor Q3 is turned on is taken as Vref/2>Vth.

When the voltage of the signal output from the CMOS inverter (Q1, Q2) of the topmost integrated-circuit 10 is the same as the first reference voltage Vref, as indicated by Eq. (3), the maximum potential VDD is impressed on the gate electrode of the transistor Q3 of the intermediate integrated-circuit 11. Consequently, the transistor Q3 is turned off. When the voltage of the signal output from the CMOS inverter (Q1, Q2) of the topmost integrated-circuit 10 is the same as the minimum potential VSS, as indicated by Eq. (4), a voltage obtained by subtracting half of the first reference voltage Vref from the maximum potential VDD is impressed on the gate electrode of the transistor Q3 of the intermediate integrated-circuit 11. Consequently, the transistor Q3 is turned on.

The voltage at the drain electrode of the transistor Q3 of the intermediate integrated-circuit 11 is pulled down by the constant current circuit 7. Consequently, when the transistor Q3 is turned on/off, the level shifting circuit 8 changes the potential of the signal at the drain electrode to the VSS terminal reference potential. This level-shifted signal is output from the signal output terminal SOUT of the intermediate integrated-circuit 11. At the output terminal SOUT, the voltage of the output signal is either the first reference voltage Vref or the minimum potential VSS.

The resistive voltage dividing circuit, consisting of the serially-connected resistors R5 and R6, generates at a potential divider output terminal C a voltage obtained by dividing the potential level (first reference voltage Vref or minimum potential VSS) of the signal output terminal SOUT of the intermediate integrated-circuit 11 and the second reference voltage VDD-Vref of the reference voltage terminal REFU of the bottommost integrated-circuit 12. The divided potentials are obtained by means of the following expressions. To make the explanation easy to understand, the resistors R5 and R6 are assumed to have the same resistance (R5=R6).

When the voltage of the signal output from the CMOS inverter (Q1, Q2) of the intermediate integrated-circuit 11 is the same as the first reference voltage Vref, and if the minimum potential VSS of the intermediate integrated-circuit 11 is considered as reference, the voltage generated at the potential divider output terminal C is calculated by $$[\{(VDD+Vref)-(VDD-Vref)\} \times R5/(R5+R6)]+(VDD-Vref)=VDD \quad (5)$$

When the voltage of the signal output from the CMOS inverter (Q1, Q2) of the intermediate integrated-circuit 11 is the same as the minimum voltage VSS, and if the minimum voltage VSS of the intermediate integrated-circuit 11 is considered as reference, the voltage generated at the potential divider output terminal C is calculated by $$[\{VDD-(VDD-Vref)\} \times R5/(R5+R6)]+(VDD-Vref)=VDD-Vref/2 \quad (6)$$

In this way, the voltage generated at the potential divider output terminal C is impressed on the gate electrode of the transistor Q3 of the bottommost integrated-circuit 12. Here, the magnitude correlation between the first reference voltage Vref and the threshold voltage Vth when the transistor Q3 is turned on is taken as Vref/2>Vth.

When the voltage of the signal output from the CMOS inverter (Q1, Q2) of the intermediate integrated-circuit 11 is the same as the first reference voltage Vref, as indicated by Eq. (5), the maximum potential VDD is impressed on the gate electrode of the transistor Q3 of the bottommost integrated-circuit 12. Consequently, the transistor Q3 is turned off. When the voltage of the signal output from the CMOS inverter (Q1, Q2) of the intermediate integrated-circuit 11 is the same as the minimum potential VSS, as indicated by Eq. (6), a voltage obtained by subtracting half of the first reference voltage Vref from the maximum potential VDD is impressed on the gate electrode of the transistor Q3 of the bottommost integrated-circuit 12. Consequently, the transistor Q3 is turned on.

The voltage at the drain electrode of the transistor Q3 of the bottommost integrated-circuit 12 is pulled down by the constant current circuit 7. Consequently, when the transistor Q3 is turned on/off, the level shifting circuit 8 changes the potential of the signal at the drain electrode to the VSS terminal reference potential. This level-shifted signal is output from the signal output terminal SOUT of the bottommost integrated-circuit 12 via the CMOS inverter (Q1, Q2). At the output terminal SOUT, the voltage of the output signal is either the first reference voltage Vref or the minimum potential VSS.

Since the minimum potential level of the controller 3 is the same level as the minimum potential VSS of the bottommost integrated-circuit 12, the controller 3 receives the signal output from the signal output terminal SOUT of the bottommost integrated-circuit 12 as is and processes it.

Thus, according to the second embodiment of the battery-voltage monitoring system built by stacking a plurality of integrated-circuits one on top of another, each of the integrated-circuits combines the function of changing the voltage of the detection signal received from the integrated-circuit at the next higher level to the minimum reference potential and outputting the level-shifted signal to the integrated-circuit at the next lower level. Consequently, any cell mal-charging detected in the topmost integrated-circuit is transmitted to the bottommost integrated-circuit via the intermediate integrated-circuit and from the bottommost integrated-circuit to the controller.

Figure 5:
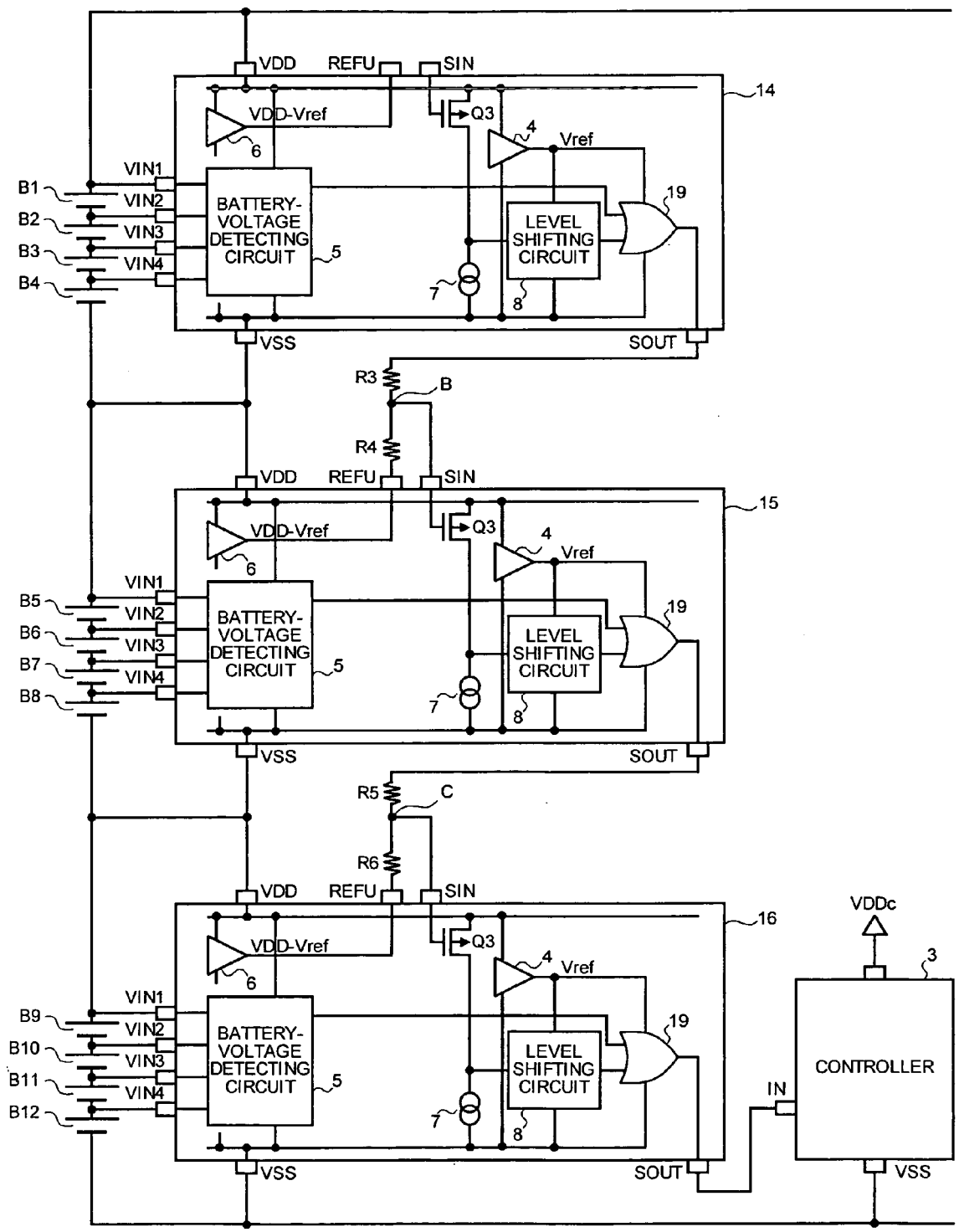
FIG. 5 is a circuit diagram of relevant parts of the battery-voltage monitoring system according to a third embodiment of the present invention.

FIG. 5 is a circuit diagram of the relevant parts of the battery-voltage monitoring system according to a third embodiment of the present invention. The parts in FIG. 5 that are the same as or equivalent to those in FIG. 4 have been assigned the same reference symbols or reference numerals. According to the third embodiment, the battery-voltage monitoring system is built in such a way that the process of transmitting the error signal detected in a higher integrated-circuit to a lower integrated-circuit and therefrom to a controller as described with reference to the second embodiment involves combining the error detection information detected in the battery cells the integrated-circuit is responsible for monitoring with the information received from the integrated-circuit at the next higher level and transmitting the combined information to the integrated-circuit at the next lower level.

In the battery-voltage monitoring system according to the third embodiment shown in FIG. 5, the three integrated-circuits 10, 11, and 12 shown in FIG. 4 are replaced by integrated-circuits 14, 15, and 16, respectively. The essential difference between the structure shown in FIG. 4 and in FIG. 5 is that in FIG. 5 each of the integrated-circuits 14, 15, and 16 includes the battery-voltage detecting circuit 5, and an OR circuit 19 instead of the CMOS inverter (Q1, Q2).

The OR circuit 19 receives the signal output from the battery-voltage detecting circuit 5 as well as the signal output from the level shifting circuit 8. The output terminal of the OR circuit 19 is connected to the signal output terminal SOUT.

The functioning of the battery-voltage monitoring system according to the third embodiment is explained next. The battery-voltage detecting circuit 5 of the topmost integrated-circuit 14 monitors the battery voltages of the battery cells B1 through B4. Similarly, the battery-voltage detecting circuit 5 of the intermediate integrated-circuit 15 monitors the battery voltages of the battery cells B5 through B8. Likewise, the battery-voltage detecting circuit 5 of the bottommost integrated-circuit 16 monitors the battery voltages of the battery cells B9 through B12.

Upon detection of mal-charging in any of the battery cells B1 through B4, the battery-voltage detecting circuit 5 of the topmost integrated-circuit issues a detection signal having a voltage of the first reference voltage Vref or the minimum voltage VSS. This detection signal is output to the signal output terminal SOUT via the OR circuit 19, and then input into the signal input terminal SIN of the intermediate integrated-circuit 15 from the divided-voltage output terminal B of the resistive potential-dividing circuit consisting of the serially-connected resistors R3 and R4.

The level shifting circuit 8 of the intermediate integrated-circuit 15 receives via the transistor Q3 the detection result from the topmost integrated-circuit 14, changes the potential of the signal to the VSS terminal reference potential, and outputs the level-shifted signal to the OR circuit 19. If any of the battery cells B5 through B8 shows signs of mal-charging, the battery-voltage detecting circuit 5 of the intermediate integrated-circuit 15 issues a signal having a voltage of the first reference voltage Vref or the minimum potential VSS, and outputs the error signal to the OR circuit 19.

A logical sum of the detection result received from the topmost integrated-circuit 14 and the information obtained as a result of monitoring of the battery voltage of the battery cells B5 through B8 by the intermediate integrated-circuit 15 is performed in the intermediate integrated-circuit 15, and the integrated battery monitoring result is output to the signal output terminal SOUT.

The signal output from the signal output terminal SOUT of the intermediate integrated-circuit 15 is input into the signal input terminal SIN of the bottommost integrated-circuit 16 from the divided-voltage output terminal C of the resistive potential-dividing circuit consisting of the serially-connected resistors R5 and R6.

The level shifting circuit 8 of the bottommost integrated-circuit 16 receives via the transistor Q3 the detection result from the intermediate integrated-circuit 15, changes the voltage of the signal to the minimum potential VSS, and outputs the level-shifted signal to the OR circuit 19. If any of the battery cells B9 through B12 shows signs of mal-charging, the battery-voltage detecting circuit 5 of the bottommost integrated-circuit 16 issues a signal having a voltage of the first reference voltage Vref or the minimum potential VSS, and outputs the error signal to the OR circuit 19.

As a result, a logical sum of the detection result received from the intermediate integrated-circuit 15 and the information obtained as a result of monitoring of the battery voltage of the battery cells B9 through B12 by the bottommost integrated-circuit 16 is performed in the bottommost integrated-circuit 16, and the integrated battery monitoring result is output to the signal output terminal SOUT.

Hence, the detection signal that is output from the signal output terminal SOUT of the bottommost integrated-circuit 16 can be said to be information obtained by integrating the voltage monitoring results of the battery cells B1 through B12. Consequently, any error signal arising from mal-charging in any of the battery cells B1 through B12 can be output to the controller 3.

An AND circuit may be used in place of the OR circuit 19 to transmit to the controller 3 error signals simultaneously arising from all the integrated-circuits.

Thus, according to the third embodiment of the battery-voltage monitoring system built by stacking a plurality of integrated-circuits one on top of another, each of the integrated-circuits combines the function of changing the voltage of the detection signal received from the integrated-circuit at the next higher level to the VSS terminal reference potential and outputting to the integrated-circuit at the next lower level the level-shifted signal along with any error signal detected in the battery cells the integrated-circuit is responsible for monitoring, hence enabling integration of all the detection results and outputting the integrated detection results from a single terminal.

Figure 6:
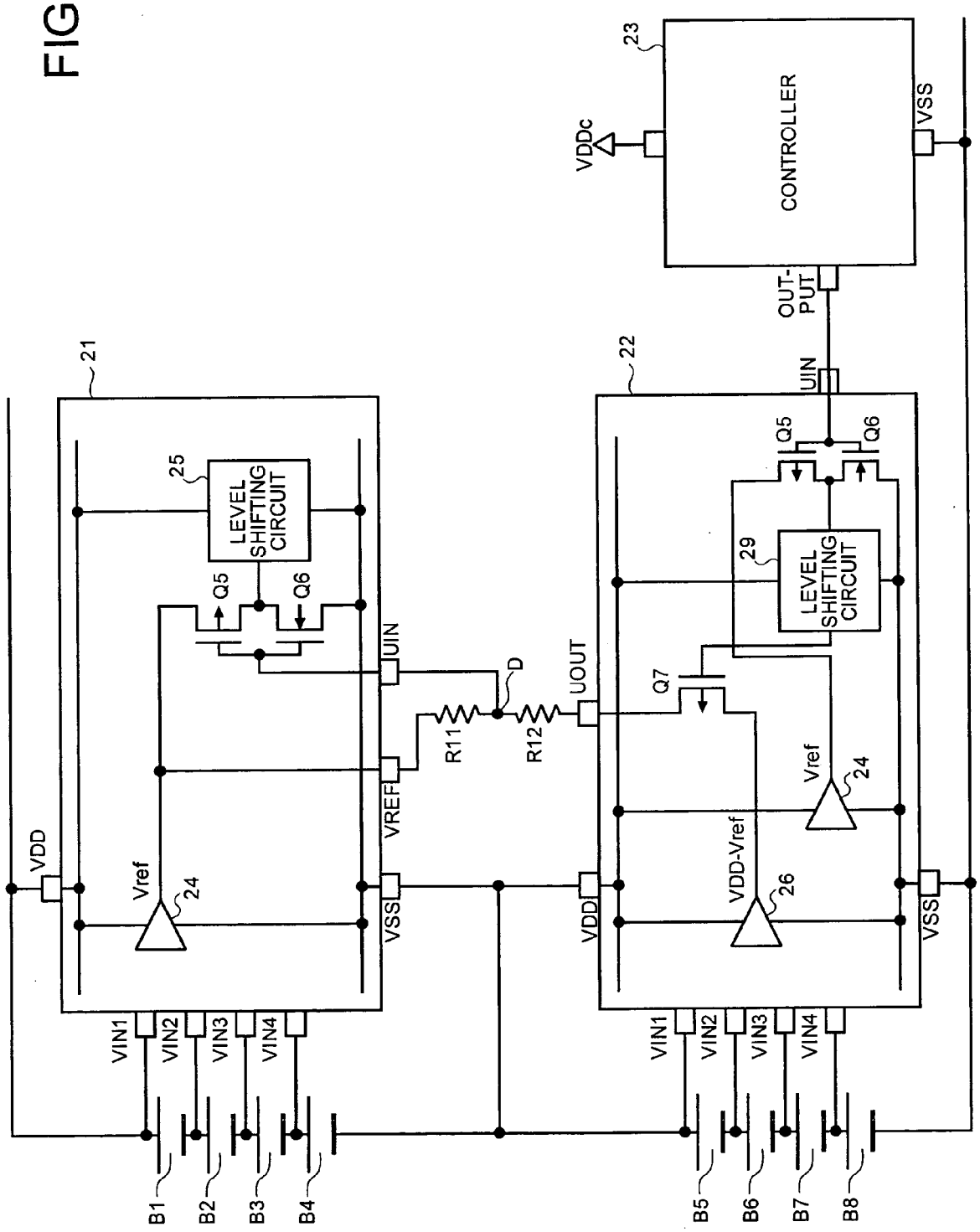
FIG. 6 is a circuit diagram of relevant parts of the battery-voltage monitoring system according to a fourth embodiment of the present invention.

FIG. 6 is a circuit diagram of the relevant parts of the battery-voltage monitoring system according to a fourth embodiment of the present invention. The parts in FIG. 6 that are the same as or equivalent to those in FIG. 1 have been assigned the same reference symbols or reference numerals. According to the fourth embodiment, the battery-voltage monitoring system is built by stacking two integrated-circuits one on top of the other as according to the first embodiment. However, the direction in which the signal is transmitted is from bottom to top.

The basic structure of the fourth embodiment is explained first. In FIG. 6, an upper integrated-circuit 21 and a lower integrated-circuit 22 each has a VDD terminal, which is a maximum potential terminal, and a VSS terminal, which is a minimum potential terminal. The VSS terminal of the upper integrated-circuit 21 and the VDD terminal of the lower integrated-circuit 22 are connected to each other.

The eight serially-connected battery cells B1 through B8 are connected to the upper integrated-circuit 21 and the lower integrated-circuit 22 in the same manner as explained with reference to the first embodiment (and FIG. 1). Further, in FIG. 6, the battery-voltage detecting circuit is not shown in either of the integrated-circuits 21 and 22.

The upper integrated-circuit 21 includes a reference voltage source 24 that generates the first reference voltage Vref based on the maximum potential VDD and the minimum potential VSS, a CMOS inverter (Q5,Q6) disposed between the output terminal of the reference voltage source 24 and the VSS terminal, a signal input terminal SIN to which the input terminal of the CMOS inverter (Q5,Q6) is connected, and a level shifting circuit 25 disposed between the VDD terminal and the VSS terminal and that changes the voltage of the signal output from the CMOS inverter (Q5,Q6) to the VSS terminal reference voltage.

Transistor Q5 of the CMOS inverter (Q5,Q6) is a PMOS transistor. The source electrode of the transistor Q5 is connected to the output terminal of the reference voltage source 24. Transistor Q6 is an NMOS transistor. The source electrode of the transistor Q6 is connected to the VSS terminal. The gate electrodes of the transistors Q5 and Q6 are connected to each other to form an output terminal, which in turn is connected to the input terminal of the level shifting circuit 25.

The level shifting circuit 25 has a structure similar to the level shifting circuit 8 shown in FIG. 2 with the exception that the level shifting circuit 25 has a VDD terminal in place of the first reference voltage Vref.

The lower integrated-circuit 22 includes a signal output terminal UOUT, a reference voltage source 26 that generates the second reference voltage VDD-Vref based on the maximum potential VDD and the minimum potential VSS, a transistor Q7 disposed between the output terminal of the reference voltage source 26 and the signal output terminal UOUT, the reference voltage source 24 that generates the first reference voltage Vref based on the maximum potential VDD and the minimum potential VSS, the CMOS inverter (Q5,Q6) disposed between the output terminal of the reference voltage source 24 and the VSS terminal, and whose input terminal receives the signal from a controller 23, and a level shifting circuit 29 disposed between the VDD terminal and the VSS terminal and that changes the voltage of the output signal received from the CMOS inverter (Q5,Q6) to the VSS terminal reference voltage.

Transistor Q7 of the lower integrated-circuit 22 is a PMOS transistor. The source electrode of the transistor Q7 is connected to the output terminal of the reference voltage source 26, the drain electrode is connected to the signal output terminal UOUT, and the gate electrode is connected to the output terminal of the level shifting circuit 29.

A reference voltage terminal VREF of the upper integrated-circuit 21 and the signal output terminal UOUT of the lower integrated-circuit 22 are connected by a resistive potential-dividing circuit (represented in FIG. 6 by serially-connected resistors R11 and R12). A divided-voltage output terminal D of the resistive potential-dividing circuit (R11, R12) is connected to a signal input terminal UIN of the upper integrated-circuit 21. The VSS terminal of lower integrated-circuit 22 and the VSS terminal of the controller 23 are connected to each other. The maximum potential at a VDDc terminal of the controller 23 is 3.3 V.

Figure 7:
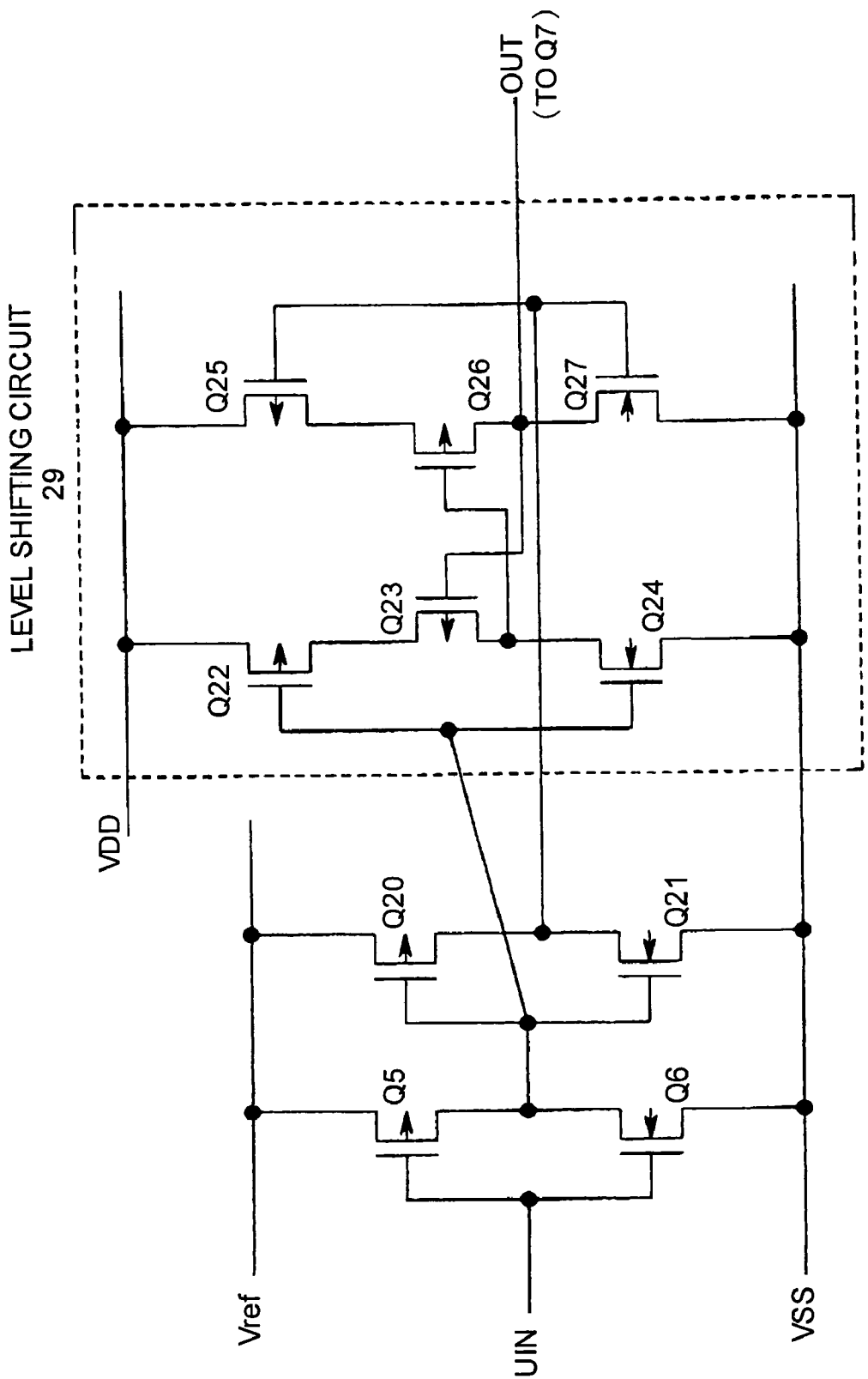
FIG. 7 is a circuit diagram of a level shifting circuit provided in a lower integrated-circuit shown in FIG. 6.

FIG. 7 is a circuit diagram of the level shifting circuit 29. The CMOS inverter (Q5,Q6) along with another CMOS inverter (Q20,Q21), disposed between the level shifting circuit 29 and the CMOS inverter (Q5,Q6), is also shown alongside the circuit diagram of the level shifting circuit 29 in FIG. 7. Like the CMOS inverter (Q5,Q6), the CMOS inverter (Q20,Q21) is disposed between the output terminal (the first reference voltage Vref) of the reference voltage source 24 and the VSS terminal. The output terminal of the CMOS inverter (C5,C6) is connected to the input terminal of the CMOS inverter (Q20,Q21) and the input terminal of the level shifting circuit 29.

The level shifting circuit 29 includes PMOS transistors Q22, Q23, Q25, and Q26, and NMOS transistors Q24 and Q27. The source electrodes of the PMOS transistors Q22 and Q25 are connected to the VDD terminal and the source electrodes of the NMOS transistors Q24 and Q27 are connected to the VSS terminal. The gate electrode of the PMOS transistor Q22 and the gate electrode of the NMOS transistor are connected to each other to form an input terminal, which in turn is connected to the input terminal of the CMOS inverter (Q20,Q21). The drain electrode of the PMOS transistor Q22 and the drain electrode of the NMOS transistor Q24 are connected through the PMOS transistor Q23.

The gate electrode of the PMOS transistor Q25 and the gate electrode of the NMOS transistor Q27 are connected to each other to form an input terminal, which in turn is connected to the output terminal of the CMOS inverter (Q20,Q21). The drain electrode of the PMOS transistor Q25 and the drain electrode of the NMOS transistor Q27 are connected through the PMOS transistor Q26. The gate electrode of the PMOS transistor Q26 is connected to the drain electrode of the NMOS transistor Q24, and the gate electrode of the PMOS transistor Q23 is connected to the drain electrode of the NMOS transistor Q27. The drain electrode of the NMOS transistor Q27 serves as an output terminal to the transistor Q7.

The output (of Vref level and VSS level) of the CMOS inverter (Q5,Q6) and the signal with a level that is the reverse of the Vref level and VSS level is input into the level shifting circuit 29. The level shifting circuit 29 outputs the signal by changing the output level (Vref level and VSS level) to VDD level and VSS level without changing the polarity.

The functioning of the battery-voltage monitoring system according to the fourth embodiment is explained next. The controller 23 outputs a binary level control signal to the lower integrated-circuit 22. The level shifting circuit 29 of the lower integrated-circuit 22 changes the voltage of the control signal from the controller 23 received via the CMOS inverter (Q5,Q6) to a level between the maximum potential VDD and the minimum potential VSS. The signal output from the level shifting circuit 29 is received at the signal output terminal UOUT via the transistor Q7.

When the level-shifted signal is impressed on the signal output terminal UOUT, the resistive potential-dividing circuit, consisting of the serially-connected resistors R11 and R12, generates at the potential divider output terminal D a voltage obtained by dividing the voltage of the signal output terminal UOUT of the lower integrated-circuit 22 and the first reference voltage Vref of the reference voltage terminal VREF of the upper integrated-circuit 21. The potential generated at the potential divider output terminal D is impressed on the CMOS inverter (Q5,Q6) via the signal input terminal UIN of the upper integrated-circuit 21. Assuming for the sake of simplification that the resistors R11 and R12 have the same resistance (R11=R12), and assuming that the VSS terminal voltage of the lower integrated-circuit 22 is taken as the reference level, the voltage at the potential divider output terminal D becomes VDD+Vref when the transistor Q7 is turned off, and as follows when the transistor Q7 is turned on:

$$[\{VDD-Vref\}-VDD-Vref]\times R12/(R11+R12)]+(VDD-Vref)=VDD \qquad (7)$$

However, if the VSS terminal voltage of the upper integrated-circuit 21 is taken as the reference level, the voltage at the potential divider output terminal D becomes low level (0 V) when the transistor Q7 is turned on and high level (Vref) when the transistor Q7 is turned off.

Thus, when the voltage produced at the potential divider output terminal D is impressed on the CMOS inverter (Q5,Q6) of the upper integrated-circuit 21, the CMOS inverter (Q5,Q6) is able to perform a reverse operation in response to the ON/OFF state of the transistor Q7 of the lower integrated-circuit 22. In effect, the controller 23 outputs control signals to turn the transistor Q7 of the lower integrated-circuit 22 on or off, thereby causing the CMOS inverter (Q5,Q6) of the upper integrated-circuit 21 to perform a reverse operation and enabling the control signals to be picked up by a not shown processing circuit (for instance, a circuit that resets the battery-voltage detecting circuit) via the level shifting circuit 25.

Thus, according to the fourth embodiment of the battery-voltage monitoring system built by stacking a minimum possible number of two integrated-circuits one on top of the other, the control signals issued from the controller can be transmitted to the upper integrated-circuit via the lower integrated-circuit.

A modification of the fourth embodiment is explained next. This can be realized by providing in the upper integrated-circuit 1 shown in FIG. 1, the reference voltage terminal VREF from which the first reference voltage Vref is output, the CMOS inverter (Q5,Q6) disposed between the first reference voltage Vref and the VSS terminal, the signal input terminal UIN which is connected to the input terminal of the CMOS inverter (Q5,Q6), and the level shifting circuit 25 disposed between the VDD terminal and the VSS terminal and that changes the voltage of the signal output from the CMOS inverter (Q5,Q6) to the VSS terminal reference potential, provided in the upper integrated-circuit 21.

Further, the lower integrated-circuit 2 shown in FIG. 1 should include the signal output terminal UOUT, the transistor Q7 disposed between the second reference voltage VDD-Vref and the signal output terminal UOUT, the CMOS inverter (Q5,Q6) disposed between the first reference voltage Vref and the VSS terminal and that receives at the input terminal the signal from the controller 3, and the level shifting circuit 29 disposed between the VDD terminal and the VSS terminal and that changes the voltage of the output signal from the CMOS inverter (Q5,Q6) to the VSS terminal reference voltage and impresses the level-shifted output signal on the gate electrode of the transistor Q7, provided in the lower integrated-circuit 22.

Further, by connecting the resulting upper integrated-circuit and the lower integrated-circuit by a second resistive potential-dividing circuit (R11, R12) shown in FIG. 6, signals can be transmitted both ways, that is, from bottom to top as well as from top to bottom.

Figure 8:
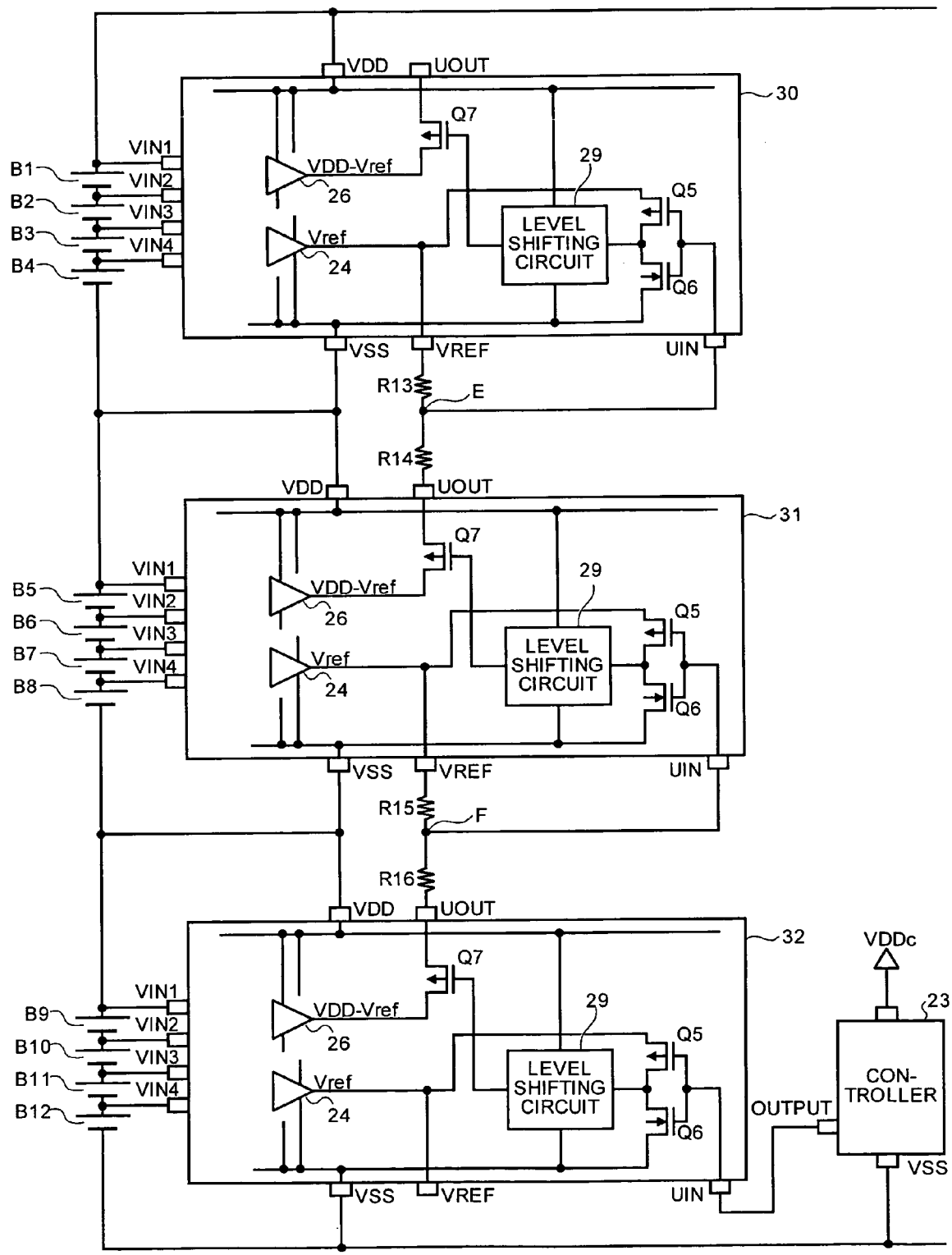
FIG. 8 is a circuit diagram of relevant parts of the battery-voltage monitoring system according to a fifth embodiment of the present invention.

FIG. 8 is a circuit diagram of the relevant parts of the battery-voltage monitoring system according to a fifth embodiment of the present invention. The parts in FIG. 8 that are the same as or equivalent to those in FIG. 6 have been assigned the same reference symbols or reference numerals. According to the fifth embodiment, the battery-voltage monitoring system is built as a three-level structure, having a topmost integrated-circuit, an intermediate integrated-circuit, and a bottommost integrated-circuit, all having an identical structure, and as a transmission channel that transmits the control signal output from the controller from the bottommost integrated-circuit to the topmost integrated-circuit via the intermediate integrated-circuit.

In FIG. 8, three integrated-circuits 30, 31, and 32, stacked one on top of another, form the battery-voltage monitoring system. The basic structure of the fifth embodiment is explained first. In FIG. 8, a topmost integrated-circuit 30, an intermediate integrated-circuit 31, and a bottommost integrated-circuit 32 each has a VDD terminal, which is a maximum potential terminal, and a VSS terminal, which is a minimum potential terminal. The VSS terminal of the topmost integrated-circuit 30 is connected to the VDD terminal of the intermediate integrated-circuit 31, and the VSS terminal of the intermediate integrated-circuit 31 is connected to the VDD terminal of the bottommost integrated-circuit 32.

The 12 serially-connected battery cells B1 through B12 are connected to the topmost integrated-circuit 30, the intermediate integrated-circuit 31, and the bottommost integrated-circuit 32 in the same manner as explained with reference to the second embodiment (and FIG. 4). Further, in FIG. 8, the battery-voltage detecting circuit is not shown in any of the integrated-circuits 30, 31, and 32.

All the integrated-circuits 30, 31, and 32 have a structure identical to that of the lower integrated-circuit 22 shown in FIG. 6. In other words, to serve as a transmission channel, each of the integrated-circuits 30, 31, and 32 includes the reference voltage source 24 that generates the first reference voltage Vref based on the maximum potential VDD and the minimum potential VSS, the reference voltage terminal VREF to which the output terminal of the reference voltage source 24 connects, the CMOS inverter (Q5,Q6) disposed between the output terminal of the reference voltage source 24 and the VSS terminal, the signal input terminal UIN to which the input terminal of the CMOS inverter (Q5,Q6) connects, the level shifting circuit 29 disposed between the VDD terminal and the VSS terminal and that receives the signal output from the CMOS inverter (Q5,Q6), the signal output terminal UOUT, the reference voltage source 26 that generates the second reference voltage VDD-Vref based on the maximum potential VDD and the minimum potential VSS, and the transistor Q7 disposed between the output terminal of the reference voltage source 26 and the signal output terminal UOUT and whose gate electrode receives the signal output from the level shifting circuit 29.

The reference voltage terminal VREF of the topmost integrated-circuit 30 and the signal output terminal UOUT of the intermediate integrated-circuit 31 are connected by means of a resistive potential-dividing circuit (represented in FIG. 8 by serially-connected resistors R13 and R14). A divided-voltage output terminal E of the resistive potential-dividing circuit (R13,R14) is connected to the signal input terminal UIN of the topmost integrated-circuit 30.

The reference voltage terminal VREF of the intermediate integrated-circuit 31 and the signal output terminal UOUT of the bottommost integrated-circuit 32 are connected by means of a resistive potential-dividing circuit (represented in FIG. 8 by serially-connected resistors R15 and R16). A divided-voltage output terminal F of the resistive potential-dividing circuit (R13,R14) is connected to the signal input terminal UIN of the intermediate integrated-circuit 31. The VSS terminal of the bottommost integrated-circuit 32 and the VSS terminal of the controller 23 are connected to each other. The maximum potential at the VDDc terminal of the controller 23 is 3.3 V.

The functioning of the battery-voltage monitoring system according to the fifth embodiment is explained next. The controller 23 outputs a binary level control signal to the bottommost integrated-circuit 32. The maximum potential at the VDDc terminal of the controller 23 is 3.3 V. However, the maximum potential VDD of the bottommost integrated-circuit 32 is equivalent to the voltage of four cells (that is, 4.2×4=16.8 V). The CMOS inverter (Q5,Q6) changes the voltage of the signal received from the controller 23 to either the first reference voltage Vref or the minimum potential VSS. The voltage of the output signal from the CMOS inverter (Q5,Q6) is changed to the VSS terminal reference voltage by the level shifting circuit 29 and is transmitted to the signal output terminal UOUT via the transistor Q7.

When the level-shifted signal is impressed on the signal output terminal UOUT, the resistive potential-dividing circuit, consisting of the serially-connected resistors R15 and R16, generates at the potential divider output terminal F a voltage obtained by dividing the voltage of the signal output terminal UOUT of the bottommost integrated-circuit 32 and the first reference voltage Vref of the reference voltage terminal VREF of the intermediate integrated-circuit 31. The voltage generated at the potential divider output terminal F is impressed on the CMOS inverter (Q5,Q6) via the signal input terminal UNI of the intermediate integrated-circuit 31. If the VSS terminal voltage of the intermediate integrated-circuit 31 is taken as the reference level, the voltage at the potential divider output terminal F becomes low level (0 V) when the transistor Q7 is turned on and high level (Vref) when the transistor Q7 is turned off.

In this way, the CMOS inverter (Q5,Q6) of the intermediate integrated-circuit 31 is able to perform a reverse operation in response to the ON/OFF state of the transistor Q7 of the bottommost integrated-circuit 32. Similarly, the voltage of signal output from the CMOS inverter (Q5,Q6) of the intermediate integrated-circuit 31 is also changed to the VSS terminal reference voltage by the level shifting circuit 29 of the intermediate integrated-circuit 31, and transmitted to the signal output terminal UOUT via the transistor Q7 of the intermediate integrated-circuit 31.

Meanwhile, the potential at the divided-voltage output terminal E of the resistive potential-dividing circuit (R13, R14), generated by dividing the voltage of the signal output terminal UOUT of the intermediate integrated-circuit 31 and the first reference voltage Vref generated at the reference voltage terminal VREF of the topmost integrated-circuit 30, is impressed on the CMOS inverter (Q5,Q6) via the signal input terminal UIN of the topmost integrated-circuit 30.

In this way, the CMOS inverter (Q5,Q6) of the topmost integrated-circuit 30 is able to perform a reverse operation in response to the ON/OFF state of the transistor Q7 of the intermediate integrated-circuit 31 and the voltage of the signal output from the CMOS inverter (Q5,Q6) of the topmost integrated-circuit 30 is changed to the VSS terminal reference voltage by the level shifting circuit 29 of the topmost integrated-circuit 30, and transmitted to the signal output terminal UOUT via the transistor Q7 of the topmost integrated-circuit 30.

Thus, according to the fifth embodiment of the battery-voltage monitoring system built by stacking a plurality of integrated-circuits one on top of another, each of the integrated-circuits combines the function of changing the voltage of the signal received from the integrated-circuit below it to a voltage corresponding to the first reference voltage and minimum potential VSS and changing the voltage of the signal to the minimum potential reference voltage, outputting the level-shifted signal to the next higher level with the second reference voltage as the reference, and supplying the first reference potential to the next higher level. Thus, the signal can be transmitted from bottom to top by successively changing the voltage of the output using the first reference voltage supplied by the integrated-circuit at the next higher level.

A modification of the fifth embodiment is explained next. This can be realized by providing in the integrated-circuits 10, 11, and 12 shown in FIGS. 3A and 3B, the reference voltage terminal VREF to which the first reference voltage Vref connects, the CMOS inverter (Q5,Q6) disposed between the first reference voltage Vref and the VSS terminal, the signal input terminal UIN to which the input terminal of the CMOS inverter (Q5,Q6) connects, the level shifting circuit 29 disposed between the VDD terminal and the VSS terminal and that receives the signal output from the CMOS inverter (Q5,Q6), the signal output terminal UOUT, and the transistor Q7 disposed between the second reference voltage VDD-Vref and the signal output terminal UOUT and whose gate electrode receives the signal output from the level shifting circuit 29, provided respectively in the integrated-circuits 30, 31, and 32.

Further, by connecting the resulting three integrated-circuits by means of second resistive potential-dividing circuits (R13,R14) and (R15,R16), signals can be transmitted both ways, that is, from bottom to top as well as from top to bottom. The same modifications can be made in the integrated-circuit 14, 15, and 16 to realize a similar effect.

Figure 9:
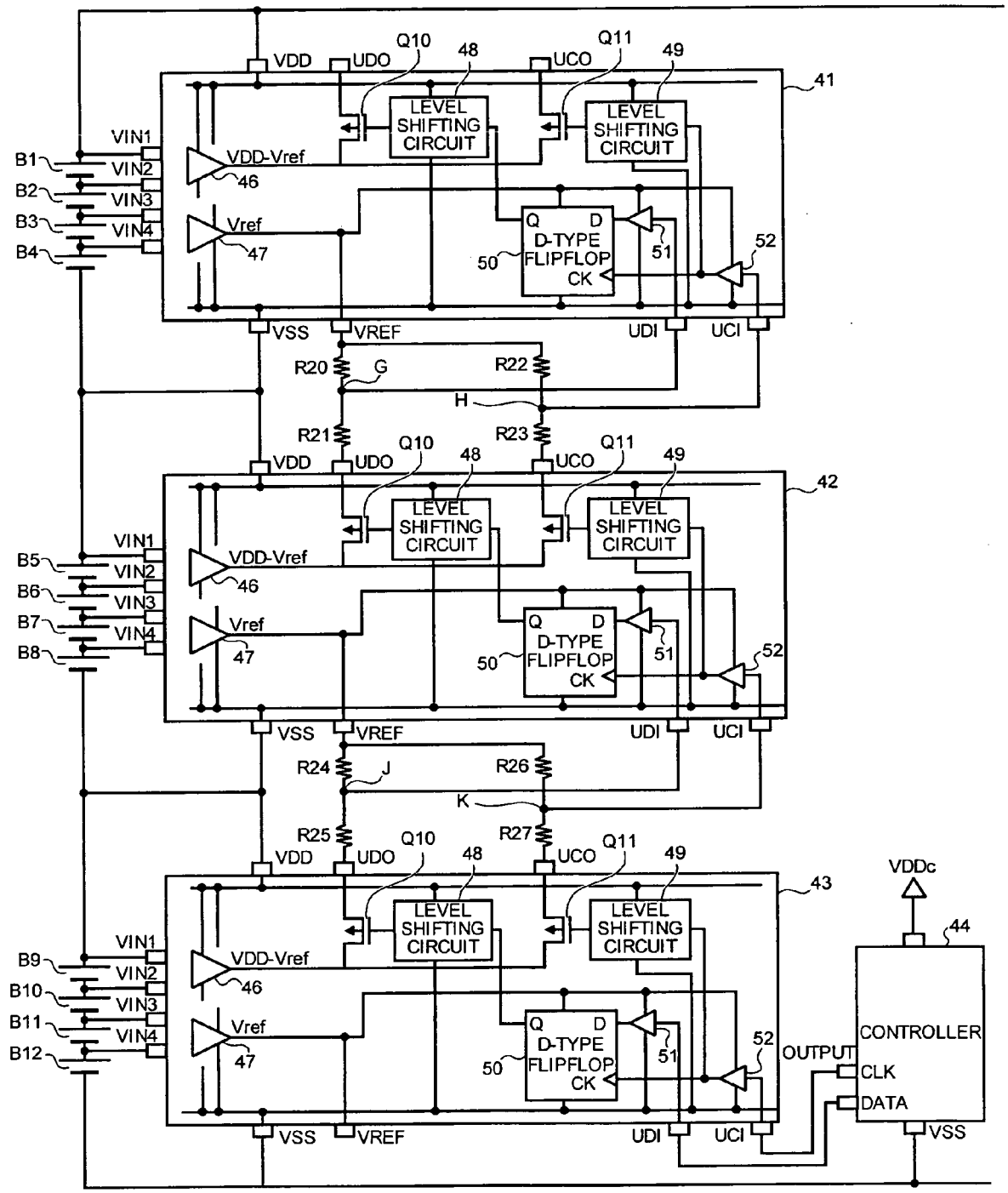
FIG. 9 is a circuit diagram of relevant parts of the battery-voltage monitoring system according to a sixth embodiment of the present system.

FIG. 9 is a circuit diagram of the relevant parts of the battery-voltage monitoring system according to a sixth embodiment of the present invention. According to the sixth embodiment, the battery-voltage monitoring system is built as a three-level structure, having a topmost integrated-circuit, an intermediate integrated-circuit, and a bottommost integrated-circuit, all having an identical structure, and that incorporates a simple data transmission channel.

In FIG. 9, three integrated-circuits 41, 42, and 43, stacked one on top of another, form the battery-voltage monitoring system. The basic structure of the fifth embodiment is explained first. In FIG. 9, a topmost integrated-circuit 41, an intermediate integrated-circuit 42, and a bottommost integrated-circuit 43 each has a VDD terminal, which is a maximum potential terminal, and a VSS terminal, which is a minimum potential terminal. The VSS terminal of the topmost integrated-circuit 41 is connected to the VDD terminal of the intermediate integrated-circuit 42, and the VSS terminal of the intermediate integrated-circuit 42 is connected to the VDD terminal of the bottommost integrated-circuit 43.

The battery-voltage detecting circuit is not shown in any of the integrated-circuits 41, 42, and 43. The 12 serially-connected battery cells B1 through B12 are connected to the topmost integrated-circuit 41, the intermediate integrated-circuit 42, and the bottommost integrated-circuit 43 in the same manner as explained with reference to the preceding embodiment.

To serve as a transmission channel, all the integrated-circuits 41, 42, and 43 have an identical structure. In other words, each of the integrated-circuits 41, 42, and 43 includes reference voltage sources 46 and 47, level shifting circuits 48 and 49, a D-type flip-flop 50, buffers 51 and 52, transistors Q10 and Q11, a reference voltage terminal VREF, a data input terminal UDI, a clock input terminal UCI, a data output terminal UDO, and a clock output terminal UCO.

The reference voltage source 47 generates the first reference voltage Vref based on the maximum potential VDD and the minimum potential VSS. The output terminal of the reference voltage source 47 is connected to the reference voltage terminal VREF. The D-type flip-flop 50 and the buffers 51 and 52 are disposed between the output terminal of the reference voltage source 47 and the VSS terminal. The input terminal of the buffer 51 is connected to the data input terminal UDI and the output terminal of the buffer 51 is connected to a data input terminal D of the D-type flip-flop 50. The input terminal of the buffer 52 is connected to the clock input terminal UCI and the output terminal of the buffer 52 is connected to a clock input terminal CK of the D-type flip-flop 50 and the input terminal of the level shifting circuit 49. A data output terminal Q of the D-type flip-flop 50 is connected to the input terminal of the level shifting circuit 48.

Both the level shifting circuits 48 and 49 are disposed between the VDD terminal and the VSS terminal. The output terminal of the level shifting circuit 48 is connected to the gate electrode of the transistor Q10. The output terminal of the level shifting circuit 49 is connected to the gate electrode of the transistor Q11. The reference voltage source 46 generates the second reference voltage VDD-Vref based on the maximum potential VDD and the minimum potential VSS.

Both the transistors Q10 and Q11 are PMOS transistors. The source electrode of each of the transistors Q10 and Q11 are connected to the output terminal of the reference voltage source 46. The drain electrode of the transistor Q10 is connected to the data output terminal UDO and the drain electrode of the transistor Q11 is connected to the data-clock output terminal UCO.

The reference voltage terminal VREF of the topmost integrated-circuit 41 and the data output terminal UDO of the intermediate integrated-circuit 42 are connected by means of a resistive potential-dividing circuit (represented in FIG. 9 by serially-connected resistors R20 and R21). A divided-voltage output terminal G of the resistive potential-dividing circuit (R20,R21) is connected to the data output terminal UDI of the topmost integrated-circuit 41. The reference voltage terminal REFU of the topmost integrated-circuit 41 and the clock output terminal UCO of the intermediate integrated-circuit 42 are connected by means of another resistive potential-dividing circuit (represented in FIG. 9 by resistors R22 and R23). A divided-voltage output terminal H of the resistive potential-dividing circuit H of the resistive potential-dividing circuit (R22,R23) is connected to the clock input terminal of the topmost integrated-circuit 41.

The reference voltage terminal VREF of the intermediate integrated-circuit 42 and the data output terminal UDO of the bottommost integrated-circuit 43 are connected by means of a resistive potential-dividing circuit (represented in FIG. 9 by resistors R24 and R25). A divided-voltage output terminal J of the resistive potential-dividing circuit (R24, R25) is connected to the data input terminal UDI of the intermediate integrated-circuit 42. The reference voltage terminal VREF of the intermediate integrated-circuit 42 and the clock output terminal UCO of the bottommost integrated-circuit 43 are connected by means of another resistive potential-dividing circuit (represented in FIG. 9 by resistors R26 and R27. A divided-voltage output terminal K of the resistive potential-dividing circuit (R26,R27) is connected to the clock input terminal UCI of the intermediate integrated-circuit 42.

The VSS terminal of the bottommost integrated-circuit 43 and the VSS terminal of a controller 44 are connected to each other. The data input terminal UDI of the bottommost integrated-circuit 43 is connected to a data output terminal (DATA) of the controller 44 and the clock input terminal UCI of the bottommost integrated-circuit 43 is connected to a clock output terminal (CLK) of the controller 44. The maximum potential at a VDDc terminal of the controller 44 is 3.3V.

The functioning of the battery-voltage monitoring system according to the sixth embodiment is explained next. The clock CLK from the controller 44 is received in the bottommost integrated-circuit 43 by the clock input terminal CK of the D-type flip-flop 50 via the buffer 52, and is transmitted to the clock input terminal UCI of the intermediate integrated-circuit 42 via the level shifting circuit 49, the transistor Q11, the clock output terminal UCO, and the resistive potential-dividing circuit (R26,R27).

The data DATA from the controller 44 is received in the bottommost integrated-circuit 43 by the data input terminal D of the D-type flip-flop via the buffer 51. The D-type flip-flop 50 retrieves the data DATA from the buffer 51 and outputs the retrieved data according to the clock CLK from the buffer 52. The data output from the D-type flip-flop is transmitted to the data input terminal UDI of the intermediate integrated-circuit 42 via the level shifting circuit 48, the transistor Q10, the data output terminal UDO, and the resistive potential-dividing circuit (R24,R25).

Similarly, the clock CLK and the data DATA are transmitted from the intermediate integrated-circuit 42 to the topmost integrated-circuit 41.

Thus, the D-type flip-flop provided in each of the integrated-circuit 43, 42, and 41 constitutes a shift register, and when the controller 44 outputs to the bottommost integrated-circuit 43 the data DATA synchronous with the clock CLK, the data DATA gets transmitted serially from the bottommost integrated-circuit 43 to the topmost integrated-circuit 41. In FIG. 9, each integrated-circuit is provided with a single flip-flop. However, it would be practical to provide two or more flip-flops.

Thus, according to the sixth embodiment of the battery-voltage monitoring system built by providing one or more flip-flop in each of the stacked integrated-circuits, and enabling the flip-flops to function according to the clock signal, a shift register is incorporated in the battery-voltage monitoring system that transmits data serially.

Thus, it is possible for the controller to send instruction to each of the integrated-circuits and enable the integrated-circuits to manage and control individual battery cell of the battery cell group each integrated-circuit is responsible for.

Further, in the battery-voltage monitoring system according to the present invention, as many serially-connected battery-voltage monitoring integrated-circuits are stacked one on top of another as are required to monitor the voltage of the plurality of serially-connected rechargeable batteries, and the detection results of all the battery-voltage monitoring integrated-circuits are integrated prior to outputting them. Further, each of the stacked battery-voltage monitoring integrated-circuits can be managed and controlled. Hence, the battery-voltage monitoring system according to the present invention can be used for monitoring lithium-ion rechargeable batteries.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A battery-voltage monitoring integrated-circuit that monitors a voltage of each of a specified-number of serially-connected secondary batteries, the battery-voltage monitoring integrated-circuit comprising:
a first voltage source terminal that is connected to a maximum voltage terminal of the secondary batteries to be monitored, a first voltage being input to the first voltage source terminal;
a second voltage source terminal that is connected to a minimum voltage terminal of the secondary batteries to be monitored, a second voltage being input to the second voltage source terminal;
a first input terminal to which an output detection signal is input;
a first reference-voltage generating unit that receives the first voltage and the second voltage as operating voltages, and generates a first reference voltage;
a second reference-voltage generating unit that receives the first voltage and the second voltage as operating voltages, and generates a second reference voltage;
a first voltage converting unit that receives the output detection signal, and converts the output detection signal received into either the first reference voltage or the second voltage;
a second reference-voltage output terminal that outputs the second reference voltage; and
a first output terminal that outputs the output detection signal converted by the first voltage converting unit as an output detection signal, wherein
the first reference voltage is equal to or lower than the first voltage and equal to or higher than a voltage with which the first voltage converting unit can be operated, and
the second reference voltage is equal to or lower than a voltage obtained by subtracting the first reference voltage from the first voltage, and equal to or higher than the second voltage.

2. The battery-voltage monitoring integrated-circuit according to claim 1, further comprising:
a battery-voltage detecting unit that outputs a detection signal based on a result of a voltage monitoring of each of the secondary batteries; and
a logical circuit that performs a logical operation on the output detection signal converted by the first voltage converting unit and the detection signal, and outputs a voltage corresponding to either the first reference voltage or the second voltage.

3. The battery-voltage monitoring integrated-circuit according to claim 2, wherein the logical circuit is an OR circuit.

4. The battery-voltage monitoring integrated-circuit according to claim 1, further comprising:
a second input terminal to which a control signal is input;
a second voltage converting unit that receives the control signal, and converts the control signal received into either the first reference voltage or the second voltage;
a control unit that controls a supply of the control signal converted by the second voltage converting unit to a second output terminal with the second reference voltage; and a first reference-voltage output terminal that outputs the first reference voltage.

5. A battery-voltage monitoring integrated-circuit that monitors a voltage of each of a specified-number of serially-connected secondary batteries, the battery-voltage monitoring integrated-circuit comprising:

a first voltage source terminal that is connected to a maximum voltage terminal of the secondary batteries to be monitored, a first voltage being input to the first voltage source terminal;
a second voltage source terminal that is connected to a minimum voltage terminal of the secondary batteries to be monitored, a second voltage being input to the second voltage source terminal;
a clock input terminal to which a clock signal is input;
a data input terminal to which a data signal is input;
a first reference-voltage generating unit that receives the first voltage and the second voltage as operating voltages, and generates a first reference voltage;
a second reference-voltage generating unit that receives the first voltage and the second voltage as operating voltages, and generates a second reference voltage;
a first voltage converting unit that receives the clock signal, and converts the clock signal received into either the first voltage or the second voltage;
a second voltage converting unit that receives the data signal, and converts the data signal received into either the first voltage or the second voltage;
a flip-flop that accepts the data signal converted by the second voltage converting unit according to the clock signal converted by the first voltage converting unit;
a third voltage converting unit that the clock signal converted by the first voltage converting unit, and converts the clock signal converted by the first voltage converting unit received into either the first voltage or the second voltage;
a fourth voltage converting unit that receives the data signal converted by the second voltage converting unit, and converts the data signal converted by the second voltage converting unit received into either the first voltage or the second voltage;
a first control unit that controls a supply of the clock signal converted by the third voltage converting unit to a clock output terminal with the second reference voltage;
a second control unit that controls a supply of the data signal converted by the fourth voltage converting unit to a data output terminal with the second reference voltage; and
a reference-voltage output terminal that outputs the first reference voltage.

6. A battery-voltage monitoring system, comprising:
a first battery-voltage monitoring integrated-circuit including
a first voltage source terminal that is connected to a maximum voltage terminal of a specified-number of serially-connected secondary batteries to be monitored, a first voltage being input to the first voltage source terminal;
a second voltage source terminal that is connected to a minimum voltage terminal of the secondary batteries to be monitored, a second voltage being input to the second voltage source terminal;
a battery-voltage detecting unit that outputs a detection signal based on a result of a voltage monitoring of each of the secondary batteries;
a first reference-voltage generating unit that receives the first voltage and the second voltage as operating voltages, and generates a first reference voltage;
a first voltage converting unit that receives the detection signal, and converts the detection signal received into either the first reference voltage or the second voltage; and a first output terminal that outputs the detection signal converted by the first voltage converting unit as an output detection signal;
at least one battery-voltage monitoring integrated-circuit including
a third voltage source terminal that is connected to a maximum voltage terminal of the secondary batteries to be monitored, a third voltage being input to the third voltage source terminal;
a fourth voltage source terminal that is connected to a minimum voltage terminal of the secondary batteries to be monitored, a fourth voltage being input to the fourth voltage source terminal;
a first input terminal to which an output detection signal is input;
a second reference-voltage generating unit that receives the third voltage and the fourth voltage as operating voltages, and generates a second reference voltage;
a third reference-voltage generating unit that receives the third voltage and the fourth voltage as operating voltages, and generates a third reference voltage;
a second voltage converting unit that receives the output detection signal, and converts the output detection signal received into either the second reference voltage or the fourth voltage;
a reference-voltage output terminal that outputs the third reference voltage; and
a second output terminal that outputs the output detection signal converted by the second voltage converting unit as an output detection signal; and
a control circuit including a second input terminal, one voltage source terminal, and other voltage source terminal, wherein
the second integrated-circuit is serially connected to a lower stage of the first integrated-circuit,
the second voltage source terminal is connected to the third voltage source terminal,
the first output terminal is connected to the reference-voltage output terminal via a resistive potential-dividing circuit,
a divided-voltage output terminal of the resistive potential-dividing circuit is connected to the second input terminal,
the second output terminal of a lowest-stage second integrated-circuit is connected to the second input terminal, and
the fourth voltage source terminal of the lowest-stage second integrated-circuit is connected to the one voltage source terminal.

7. A battery-voltage monitoring system, comprising:
a first battery-voltage monitoring integrated-circuit including
a first voltage source terminal that is connected to a maximum voltage terminal of a specified-number of serially-connected secondary batteries to be monitored, a first voltage being input to the first voltage source terminal;
a second voltage source terminal that is connected to a minimum voltage terminal of the secondary batteries to be monitored, a second voltage being input to the second voltage source terminal;
a battery-voltage detecting unit that outputs a detection signal based on a result of a voltage monitoring of each of the secondary batteries;
a first reference-voltage generating unit that receives the first voltage and the second voltage as operating voltages, and generates a first reference voltage;

a first voltage converting unit that receives the detection signal, and converts the detection signal received into either the first reference voltage or the second voltage; and a first output terminal that outputs the detection signal converted by the first voltage converting unit as an output detection signal;

at least one battery-voltage monitoring integrated-circuit including a third voltage source terminal that is connected to a maximum voltage terminal of the secondary batteries to be monitored, a third voltage being input to the third voltage source terminal;

a fourth voltage source terminal that is connected to a minimum voltage terminal of the secondary batteries to be monitored, a fourth voltage being input to the fourth voltage source terminal;

a first input terminal to which an output detection signal is input;

a second reference-voltage generating unit that receives the third voltage and the fourth voltage as operating voltages, and generates a second reference voltage;

a third reference-voltage generating unit that receives the third voltage and the fourth voltage as operating voltages, and generates a third reference voltage;

a second voltage converting unit that receives the output detection signal, and converts the output detection signal received into either the second reference voltage or the fourth voltage;

a reference-voltage output terminal that outputs the third reference voltage;

a second output terminal that outputs the output detection signal converted by the second voltage converting unit as an output detection signal; and a logical circuit that performs a logical operation on the output detection signal converted by the second voltage converting unit and the detection signal, and outputs a voltage corresponding to either the second reference voltage or the fourth voltage; and a control circuit including a second input terminal, one voltage source terminal, and other voltage source terminal, wherein the second integrated-circuit is serially connected to a lower stage of the first integrated-circuit, the second voltage source terminal is connected to the third voltage source terminal, the first output terminal is connected to the reference-voltage output terminal via a resistive potential-dividing circuit, a divided-voltage output terminal of the resistive potential-dividing circuit is connected to the second input terminal, the second output terminal of a lowest-stage second integrated-circuit is connected to the second input terminal, and the fourth voltage source terminal of the lowest-stage second integrated-circuit is connected to the one voltage source terminal.

8. A battery-voltage monitoring system, comprising:

at least two battery-voltage monitoring integrated-circuits serially-connected from an upper stage to a lower stage, the battery-voltage monitoring integrated-circuit including a first voltage source terminal that is connected to a maximum voltage terminal of a specified-number of serially-connected secondary batteries to be monitored, a first voltage being input to the first voltage source terminal;

a second voltage source terminal that is connected to a minimum voltage terminal of the secondary batteries to be monitored, a second voltage being input to the second voltage source terminal;

a first input terminal to which an output detection signal is input;

a first reference-voltage generating unit that receives the first voltage and the second voltage as operating voltages, and generates a first reference voltage;

a second reference-voltage generating unit that receives the first voltage and the second voltage as operating voltages, and generates a second reference voltage;

a voltage converting unit that receives the output detection signal, and converts the output detection signal received into either the first reference voltage or the second voltage;

a reference-voltage output terminal that outputs the second reference voltage;

an output terminal that outputs the output detection signal converted by the first voltage converting unit as an output detection signal;

a battery-voltage detecting unit that outputs a detection signal based on a result of a voltage monitoring of each of the secondary batteries; and a logical circuit that performs a logical operation on the output detection signal converted by the voltage converting unit and the detection signal, and outputs a voltage corresponding to either the first reference voltage or the second voltage; and a control circuit including a second input terminal, one voltage source terminal, and other voltage source terminal, wherein the second voltage source terminal of an upper-stage battery-voltage monitoring integrated-circuit is connected to the first voltage source terminal of a lower-stage battery-voltage monitoring integrated-circuit, the output terminal of the upper-stage battery-voltage monitoring integrated-circuit is connected to the second reference-voltage output terminal of the lower-stage battery-voltage monitoring integrated-circuit via a resistive potential-dividing circuit, a divided-voltage output terminal of the resistive potential-dividing circuit is connected to the first input terminal of the lower-stage battery-voltage monitoring integrated-circuit, the output terminal of a lowest-stage battery-voltage monitoring integrated-circuit is connected to the second input terminal, and the second voltage source terminal of the lowest-stage battery-voltage monitoring integrated-circuit is connected to the one voltage source terminal.

9. A battery-voltage monitoring system, comprising:

a first integrated-circuit including a first voltage source terminal that is connected to a maximum voltage terminal of a specified-number of serially-connected secondary batteries to be monitored, a first voltage being input to the first voltage source terminal;

a second voltage source terminal that is connected to a minimum voltage terminal of the secondary batteries to be monitored, a second voltage being input to the second voltage source terminal;

a first input terminal to which a first control signal is input;

a first reference-voltage generating unit that receives the first voltage and the second voltage as operating voltages, and generates a first reference voltage;

a first voltage converting unit that receives the first control signal, and converts the first control signal received into either the first reference voltage or the second voltage; and a first reference-voltage output terminal that outputs the first reference voltage;

a second integrated-circuit including a third voltage source terminal that is connected to a maximum voltage terminal of the secondary batteries to be monitored, a third voltage being input to the third voltage source terminal;

a fourth voltage source terminal that is connected to a minimum voltage terminal of the secondary batteries to be monitored, a fourth voltage being input to the fourth voltage source terminal;

a second input terminal to which a second control signal is input;

a second reference-voltage generating unit that receives the third voltage and the fourth voltage as operating voltages, and generates a second reference voltage;

a second voltage converting unit that receives the second control signal, and converts the second control signal received into either the second reference voltage or the fourth voltage;

a control unit that controls a supply of the second control signal converted by the second voltage converting unit to a first output terminal with the second reference voltage; and a second reference-voltage output terminal that outputs the second reference voltage; and a control circuit including a second output terminal, one voltage source terminal, and other voltage source terminal, wherein the first integrated-circuit is serially-connected to an upper stage of the second integrated-circuit, the second voltage source terminal is connected to the third voltage source terminal, the output terminal is connected to the first reference-voltage output terminal via a resistive potential-dividing circuit, a divided-voltage output terminal of the resistive potential-dividing circuit is connected to the second input terminal, the second input terminal of a lowest-stage battery-voltage monitoring integrated-circuit is connected to the second output terminal, and the fourth voltage source terminal of the lowest-stage second integrated-circuit is connected to the one voltage source terminal.

10. A battery-voltage monitoring system, comprising:

at least two battery-voltage monitoring integrated-circuits serially-connected from an upper stage to a lower stage, the battery-voltage monitoring integrated-circuit including a first voltage source terminal that is connected to a maximum voltage terminal of a specified-number of serially-connected secondary batteries to be monitored, a first voltage being input to the first voltage source terminal;

a second voltage source terminal that is connected to a minimum voltage terminal of the secondary batteries to be monitored, a second voltage being input to the second voltage source terminal;

an input terminal to which a control signal is input;

a reference-voltage generating unit that receives the first voltage and the second voltage as operating voltages, and generates a reference voltage;

a voltage converting unit that receives the control signal, and converts the control signal received into either the reference voltage or the second voltage;

a control unit that controls a supply of the control signal converted by the voltage converting unit to a first output terminal with the reference voltage; and a reference-voltage output terminal that outputs the reference voltage; and a control circuit including a second output terminal, one voltage source terminal, and other voltage source terminal, wherein the second voltage source terminal of an upper-stage battery-voltage monitoring integrated-circuit is connected to the first voltage source terminal of a lower-stage battery-voltage monitoring integrated-circuit, the first output terminal of the lower-stage battery-voltage monitoring integrated-circuit is connected to the first reference-voltage output terminal of the upper-stage battery-voltage monitoring integrated-circuit via a resistive potential-dividing circuit, a divided-voltage output terminal of the resistive potential-dividing circuit is connected to the input terminal of the upper-stage battery-voltage monitoring integrated-circuit, the input terminal of a lowest-stage battery voltage monitoring circuit is connected to the second output terminal, and the second voltage source terminal of the lowest-stage battery voltage monitoring circuit is connected to the one voltage source terminal.

11. A battery-voltage monitoring system, comprising:

a first battery-voltage monitoring integrated-circuit including a first voltage source terminal that is connected to a maximum voltage terminal of a specified-number of serially-connected secondary batteries to be monitored, a first voltage being input to the first voltage source terminal;

a second voltage source terminal that is connected to a minimum voltage terminal of the secondary batteries to be monitored, a second voltage being input to the second voltage source terminal;

a battery-voltage detecting unit that outputs a detection signal based on a result of a voltage monitoring of each of the secondary batteries;

a first reference-voltage generating unit that receives the first voltage and the second voltage as operating voltages, and generates a first reference voltage;

a first voltage converting unit that receives the detection signal, and converts the detection signal received into either the first reference voltage or the second voltage;

a first output terminal that outputs the detection signal converted by the first voltage converting unit as an output detection signal;

a first input terminal to which a first control signal is input;

a second voltage converting unit that receives the first control signal, and converts the first control signal received into either the first reference voltage or the second voltage; and a first reference-voltage output terminal that outputs the first reference voltage;

at least one second battery-voltage monitoring integrated-circuit including
a third voltage source terminal that is connected to a maximum voltage terminal of the secondary batteries to be monitored, a third voltage being input to the third voltage source terminal;
a fourth voltage source terminal that is connected to a minimum voltage terminal of the secondary batteries to be monitored, a fourth voltage being input to the fourth voltage source terminal;
a second input terminal to which an output detection signal is input;
a second reference-voltage generating unit that receives the first voltage and the second voltage as operating voltages, and generates a second reference voltage;
a third reference-voltage generating unit that receives the first voltage and the second voltage as operating voltages, and generates a third reference voltage;
a second voltage converting unit that receives the output detection signal, and converts the output detection signal received into either the second reference voltage or the fourth voltage;
a second reference-voltage output terminal that outputs the second reference voltage;
a second output terminal that outputs the output detection signal converted by the first voltage converting unit as an output detection signal;
a third input terminal to which a second control signal is input;
a third voltage converting unit that receives the second control signal, and converts the second control signal received into either the second reference voltage or the fourth voltage;
a control unit that controls a supply of the second control signal converted by the third voltage converting unit to a third output terminal with the third reference voltage; and
a second reference-voltage output terminal that outputs the second reference voltage; and
a control circuit including a fourth input terminal, a fourth output terminal, one voltage source terminal, and other voltage source terminal, wherein
the second battery-voltage monitoring integrated-circuit is connected to a lower stage of the first battery-voltage monitoring integrated-circuit,
the second voltage source terminal is connected to the third voltage source terminal,
the first output terminal is connected to the third reference-voltage output terminal via a first resistive potential-dividing circuit,
a first divided-voltage output terminal of the first resistive potential-dividing circuit is connected to the second input terminal,
the third output terminal is connected to the first reference-voltage output terminal via a second resistive potential-dividing circuit,
a second divided-voltage output terminal of the second resistive potential-dividing circuit is connected to the first input terminal,
the second output terminal of a lowest-stage battery-voltage monitoring integrated-circuit is connected to the fourth input terminal,
the third input terminal of the lowest-stage battery-voltage monitoring integrated-circuit is connected to the fourth output terminal, and
the fourth voltage source terminal of the lowest-stage battery-voltage monitoring integrated-circuit is connected to the one voltage source terminal.

12. A battery-voltage monitoring system, comprising:
at least two battery-voltage monitoring integrated-circuits serially-connected from an upper stage to a lower stage, the battery-voltage monitoring integrated-circuit including
a first voltage source terminal that is connected to a maximum voltage terminal of a specified-number of serially-connected secondary batteries to be monitored, a first voltage being input to the first voltage source terminal;
a second voltage source terminal that is connected to a minimum voltage terminal of the secondary batteries to be monitored, a second voltage being input to the second voltage source terminal;
a first input terminal to which an output detection signal is input;
a first reference-voltage generating unit that receives the first voltage and the second voltage as operating voltages, and generates a first reference voltage;
a second reference-voltage generating unit that receives the first voltage and the second voltage as operating voltages, and generates a second reference voltage;
a first voltage converting unit that receives the output detection signal, and converts the output detection signal received into either the first reference voltage or the second voltage;
a second reference-voltage output terminal that outputs the second reference voltage;
a first output terminal that outputs the output detection signal converted by the first voltage converting unit as an output detection signal;
a second input terminal to which a control signal is input;
a second voltage converting unit that receives the control signal, and converts the control signal received into either the first reference voltage or the second voltage;
a control unit that controls a supply of the control signal converted by the second voltage converting unit to a second output terminal with the second reference voltage; and
a first reference-voltage output terminal that outputs the first reference voltage;
a control circuit including a third input terminal, a third output terminal, one voltage source terminal, and other voltage source terminal, wherein
the second voltage source terminal of an upper-stage battery-voltage monitoring integrated-circuit is connected to the first voltage source terminal of a lower-stage battery-voltage monitoring integrated-circuit,
the first output terminal of the upper-stage battery-voltage monitoring integrated-circuit is connected to the second reference-voltage output terminal of the lower-stage battery-voltage monitoring integrated-circuit via a first resistive potential-dividing circuit,
a first divided-voltage output terminal of the first resistive potential-dividing circuit is connected to the first input terminal of the lower-stage battery-voltage monitoring integrated-circuit,
the second output terminal of the lower-stage battery-voltage monitoring integrated-circuit is connected to the first reference-voltage output terminal of the upper-stage battery-voltage monitoring integrated-circuit via a second resistive potential-dividing circuit, a second divided-voltage output terminal of the second resistive potential-dividing circuit is connected to the second input terminal of the upper-stage battery-voltage monitoring integrated-circuit, the first output terminal of a lowest-stage battery-voltage monitoring integrated-circuit is connected to the third input terminal, the second input terminal of the lowest-stage battery-voltage monitoring integrated-circuit is connected to the third output terminal, and the second voltage source terminal of the lowest-stage battery-voltage monitoring integrated-circuit is connected to the one voltage source terminal.

13. A battery-voltage monitoring system, comprising:

at least two battery-voltage monitoring integrated-circuits serially-connected from an upper stage to a lower stage, the battery-voltage monitoring integrated-circuit including
- a first voltage source terminal that is connected to a maximum voltage terminal of a specified-number of serially-connected secondary batteries to be monitored, a first voltage being input to the first voltage source terminal;
- a second voltage source terminal that is connected to a minimum voltage terminal of the secondary batteries to be monitored, a second voltage being input to the second voltage source terminal;
- a clock input terminal to which a clock signal is input;
- a data input terminal to which a data signal is input;
- a first reference-voltage generating unit that receives the first voltage and the second voltage as operating voltages, and generates a first reference voltage;
- a second reference-voltage generating unit that receives the first voltage and the second voltage as operating voltages, and generates a second reference voltage;
- a first voltage converting unit that receives the clock signal, and converts the clock signal received into either the first voltage or the second voltage;
- a second voltage converting unit that receives the data signal, and converts the data signal received into either the first voltage or the second voltage;
- a flip-flop that accepts the data signal converted by the second voltage converting unit according to the clock signal converted by the first voltage converting unit;
- a third voltage converting unit that the clock signal converted by the first voltage converting unit, and converts the clock signal converted by the first voltage converting unit received into either the first voltage or the second voltage;
- a fourth voltage converting unit that receives the data signal converted by the second voltage converting unit, and converts the data signal converted by the second voltage converting unit received into either the first voltage or the second voltage;
- a first control unit that controls a supply of the clock signal converted by the third voltage converting unit to a clock output terminal with the second reference voltage;
- a second control unit that controls a supply of the data signal converted by the fourth voltage converting unit to a data output terminal with the second reference voltage; and
- a reference-voltage output terminal that outputs the first reference voltage; and a control circuit including a clock output terminal, a data output terminal, one voltage source terminal, and other voltage source terminal, wherein the second voltage source terminal of an upper-stage battery-voltage monitoring integrated-circuit is connected to the first voltage source terminal of a lower-stage battery-voltage monitoring integrated-circuit, the clock output terminal of the lower-stage battery-voltage monitoring integrated-circuit is connected to the first reference-voltage output terminal of the upper-stage battery-voltage monitoring integrated-circuit via a first resistive potential-dividing circuit, a first divided-voltage output terminal of the first resistive potential-dividing circuit is connected to the clock input terminal of the upper-stage battery-voltage monitoring integrated-circuit, the data output terminal of the lower-stage battery-voltage monitoring integrated-circuit is connected to the first reference-voltage output terminal of the upper-stage battery-voltage monitoring integrated-circuit via a second resistive potential-dividing circuit, a second divided-voltage output terminal of the second resistive potential-dividing circuit is connected to the data input terminal of the upper-stage battery-voltage monitoring integrated-circuit, the clock input terminal of a lowest-stage battery-voltage monitoring integrated-circuit is connected to the clock output terminal, the data input terminal of the lowest-stage battery-voltage monitoring integrated-circuit is connected to the data output terminal; and the second voltage source terminal of the lowest-stage battery-voltage monitoring integrated-circuit is connected to the one voltage source terminal.

* * * * *